United States Patent
Lee et al.

(10) Patent No.: US 10,008,407 B2
(45) Date of Patent: Jun. 26, 2018

(54) METHODS OF MANUFACTURING SEMICONDUCTOR DEVICES INCLUDING CONDUCTIVE STRUCTURES

(71) Applicant: Samsung Electronics Co., Ltd, Suwon-Si, Gyeonggi-do (KR)

(72) Inventors: Woo-Jin Lee, Hwaseong-si (KR); Byung-Hee Kim, Seoul (KR); Sang-Hoon Ahn, Goyang-si (KR); Woo-Kyung You, Incheon (KR); Jong-Min Baek, Seoul (KR); Nae-In Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days. days.

(21) Appl. No.: 14/955,988

(22) Filed: Dec. 1, 2015

(65) Prior Publication Data

US 2016/0163589 A1    Jun. 9, 2016

(30) Foreign Application Priority Data

Dec. 4, 2014  (KR) ........................ 10-2014-0172618

(51) Int. Cl.
*H01L 21/768* (2006.01)
*H01L 23/522* (2006.01)
*H01L 23/532* (2006.01)

(52) U.S. Cl.
CPC .. *H01L 21/76807* (2013.01); *H01L 21/76849* (2013.01); *H01L 21/76885* (2013.01); *H01L 23/5222* (2013.01); *H01L 23/53295* (2013.01); *H01L 21/76816* (2013.01); *H01L 2221/1047* (2013.01)

(58) Field of Classification Search
CPC ................... H01L 21/76822; H01L 21/76801
See application file for complete search history.

(56) References Cited

U.S. PATENT DOCUMENTS 7,741,228 B2  6/2010  Ueki et al.
8,298,911 B2  10/2012  Lee
(Continued)

FOREIGN PATENT DOCUMENTS

JP       2998678 B2       1/2000
JP    2007220934 A  *    8/2007
(Continued)

*Primary Examiner* — Charles Garber
*Assistant Examiner* — Alia Sabur
(74) *Attorney, Agent, or Firm* — Ward and Smith, P.A.

(57) ABSTRACT

A method of forming a semiconductor device can include forming an insulation layer using a material having a composition selected to provide resistance to subsequent etching process. The composition of the material can be changed to reduce the resistance of the material to the subsequent etching process at a predetermined level in the insulation layer. The subsequent etching process can be performed on the insulation layer to remove an upper portion of the insulation layer above the predetermined level and leave a lower portion of the insulation layer below the predetermined level between adjacent conductive patterns extending through the lower portion of the insulation layer. A low-k dielectric material can be formed on the lower portion of the insulation layer between the adjacent conductive patterns to replace the upper portion of the insulation layer above the predetermined level.

19 Claims, 21 Drawing Sheets

(56) References Cited

U.S. PATENT DOCUMENTS

| | | | |
|---|---|---|---|
| 8,344,474 B2 | 1/2013 | Seidel et al. | |
| 8,652,962 B2 | 2/2014 | Singh et al. | |
| 2003/0042605 A1* | 3/2003 | Andideh | H01L 21/02126 257/741 |
| 2003/0109143 A1* | 6/2003 | Hsieh | H01L 21/31116 438/710 |
| 2004/0089924 A1* | 5/2004 | Yuasa | H01L 21/02126 257/673 |
| 2005/0142853 A1* | 6/2005 | Tu | H01L 21/76807 438/624 |
| 2007/0161230 A1* | 7/2007 | Chen | H01L 21/7682 438/637 |
| 2007/0212850 A1 | 9/2007 | Ingle et al. | |
| 2011/0053380 A1* | 3/2011 | Sapre | H01L 21/31116 438/715 |
| 2012/0289043 A1* | 11/2012 | Hsieh | H01L 21/76804 438/643 |
| 2012/0319279 A1 | 12/2012 | Isobayashi | |
| 2014/0170847 A1* | 6/2014 | Iuchi | H01L 21/76837 438/597 |

FOREIGN PATENT DOCUMENTS

| | | |
|---|---|---|
| JP | 4692319 B2 | 6/2011 |
| KR | 10-2000-0003234 A | 1/2000 |
| KR | 10-2004-0060327 A | 7/2004 |
| KR | 10-2008-0030161 A | 4/2008 |
| KR | 10-2010-0036100 A | 4/2010 |
| KR | 10-1128705 B1 | 3/2012 |

\* cited by examiner

METHODS OF MANUFACTURING SEMICONDUCTOR DEVICES INCLUDING CONDUCTIVE STRUCTURES

CROSS-REFERENCE TO RELATED APPLICATION

This application claims priority under 35 USC § 119 to Korean Patent Application No. 10-2014-0172618, filed on Dec. 4, 2014 in the Korean Intellectual Property Office (KIPO), the contents of which are incorporated by reference herein in their entirety.

FIELD

Embodiments relate to methods of forming conductive structures buried in a dielectric layer, semiconductor devices including the conductive structures and methods of manufacturing the semiconductor devices.

BACKGROUND

As a semiconductor device becomes highly integrated, distances between wiring patterns included in the semiconductor device decrease. Thus, a parasitic capacitance between the neighboring wiring patterns may increase, which may reduce the reliability of the semiconductor device.

Additionally, a low-k insulation layer adjacent to the wiring patterns may be damaged while performing, for example, an etching process or a thermal treatment for the formation of the wiring patterns, and thus the parasitic capacitance may be further increased by the damage to the low-k insulation layer.

SUMMARY

According to example embodiments, a method of forming a semiconductor device can include forming an insulation layer using a material having a composition selected to provide resistance to a subsequent etching process. The composition of the material can be changed to reduce the resistance of the material to the subsequent etching process at a predetermined level in the insulation layer. The subsequent etching process can be performed on the insulation layer to remove an upper portion of the insulation layer above the predetermined level and leave a lower portion of the insulation layer below the predetermined level between adjacent conductive patterns extending through the lower portion of the insulation layer. A low-k dielectric material can be formed on the lower portion of the insulation layer between the adjacent conductive patterns to replace the upper portion of the insulation layer above the predetermined level.

According to example embodiments, a method of forming a conductive structure can include forming a sacrificial layer including an inorganic insulative material on a lower contact by an in-situ deposition process, where the sacrificial layer can have a composition at a lower portion and a different composition at an upper portion thereof. A conductive pattern can be formed to extend through the sacrificial layer to electrically connect to the lower contact. The upper portion of the sacrificial layer can be removed such that the conductive pattern is exposed by the lower portion of the sacrificial layer and an insulating interlayer can be formed on the lower portion of the sacrificial layer to cover the conductive pattern.

According to example embodiments, a method of forming a conductive structure can include forming a supporting layer including a silicon oxide-based material on a lower contact and forming a sacrificial layer including silicon carboxide or carbon-doped silicon oxide on the supporting layer. A conductive pattern can be formed to extend through the sacrificial layer and electrically connect to the lower contact. The sacrificial layer can be removed to expose the conductive pattern above the supporting layer and an insulating interlayer can be formed on the supporting layer to cover the conductive pattern.

According to example embodiments, a method of manufacturing a semiconductor device can include forming a lower insulation layer covering a semiconductor element on a substrate and forming a lower circuit electrically connected to the semiconductor element through the lower insulation layer. A first etch-stop layer can be formed to cover the lower circuit on the lower insulation layer and a supporting layer can be formed to include a silicon oxide-based material on the first etch-stop layer. A sacrificial layer can including silicon carboxide or carbon-doped silicon oxide can be formed on the supporting layer. A conductive pattern can be formed electrically connected to the lower circuit through the sacrificial layer, the supporting layer and the first etch-stop layer. The sacrificial layer can be removed such that the conductive pattern can be exposed by the supporting layer and a first insulating interlayer can be formed to cover the conductive pattern.

According to example embodiments, a semiconductor device, can include a lower insulation layer on a substrate and a lower circuit in the lower insulation layer. A supporting layer can be on the lower insulation layer and the lower circuit, where the supporting layer can include a silicon-based inorganic material. An insulating interlayer can be on the supporting layer, where the insulating interlayer can have a density that is less than that of the supporting layer. A conductive pattern can extend through the insulating interlayer and the supporting layer to electrically connect to the lower circuit and a capping layer pattern can be on a top surface of the conductive pattern.

BRIEF DESCRIPTION OF THE DRAWINGS

Example embodiments will be more clearly understood from the following detailed description taken in conjunction with the accompanying drawings.

FIGS. 1 to 10 are cross-sectional views illustrating a method of forming a conductive structure in accordance with example embodiments;

FIG. 11 is a graph showing a deposition source profile during a formation of a sacrificial layer in accordance with example embodiments;

FIGS. 12 to 14 are cross-sectional views illustrating a method of forming a conductive structure in accordance with example embodiments;

FIGS. 15 to 21 are cross-sectional views illustrating a method of forming a conductive structure in accordance with example embodiments;

FIGS. 22 to 25 are cross-sectional views illustrating a method of forming a conductive structure in accordance with example embodiments; and FIGS. 26 to 35 are cross-sectional views illustrating a method of manufacturing a semiconductor device in accordance with example embodiments.

DESCRIPTION OF EMBODIMENTS

Figure 1:
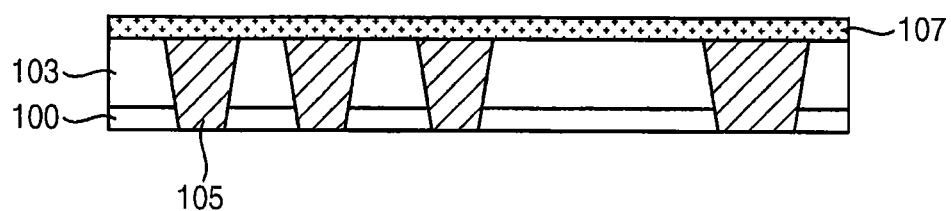
FIGS. 1 to 35 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set forth herein. Rather, these example embodiments are provided so that this description will be thorough and complete, and will fully convey the scope of the present inventive concept to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIGS. 1 to 10 are cross-sectional views illustrating a method of forming a conductive structure in accordance with example embodiments.

Referring to FIG. 1, a lower contact 105 extending through a lower insulation layer 103 may be formed. A plurality of the lower contacts 105 may be formed in the lower insulation layer 103.

In example embodiments, the lower insulation layer 103 may be formed on a passivation layer 100, and a contact hole extending through the lower insulation layer 103 and the passivation layer 100 may be formed. The lower contact 105 may be formed by forming a conductive layer in the contact hole by a deposition process or a plating process.

The lower insulation layer 103 may be formed of an insulative material such as silicon oxide or silicon oxynitride. For example, the lower insulation layer 103 may be formed of a silicon oxide-based material such as plasma enhanced oxide (PEOX), tetraethyl orthosilicate (TEOS), boro tetraethyl orthosilicate (BTEOS), phosphorous tetraethyl orthosilicate (PTEOS), boro phospho tetraethyl orthosilicate (BPTEOS), boro silicate glass (BSG), phospho silicate glass (PSG), boro phospho silicate glass (BPSG), or the like.

The passivation layer 100 may be formed of silicon nitride. The conductive layer may be formed of a metal such as aluminum (Al), tungsten (W) or copper (Cu), or a metal nitride.

In some embodiments, the lower contact 105 may be electrically connected to a circuit device or a lower wiring formed on a semiconductor substrate. Damages to the circuit device or the lower wiring while forming the contact hole may be prevented by the passivation layer 100.

A first etch-stop layer 107 covering the lower contacts 105 may be formed on the lower insulation layer 103. The first etch-stop layer 107 may be formed of silicon nitride, silicon oxynitride, silicon carbonitride or a metal. The first etch-stop layer 107 may be formed as a single layer including one of the materials, or as a multi-layered structure including at least two of the materials.

For example, the first etch-stop layer 107 may be formed by a at least one process of a chemical vapor deposition (CVD) process, a plasma enhanced chemical vapor deposition (PECVD) process, a low pressure chemical vapor deposition (LPCVD) process, a high density plasma chemical vapor deposition (HDP-CVD) process, a spin coating process, a sputtering process, an atomic layer deposition (ALD) process, and a physical vapor deposition (PVD) process.

Figure 2:
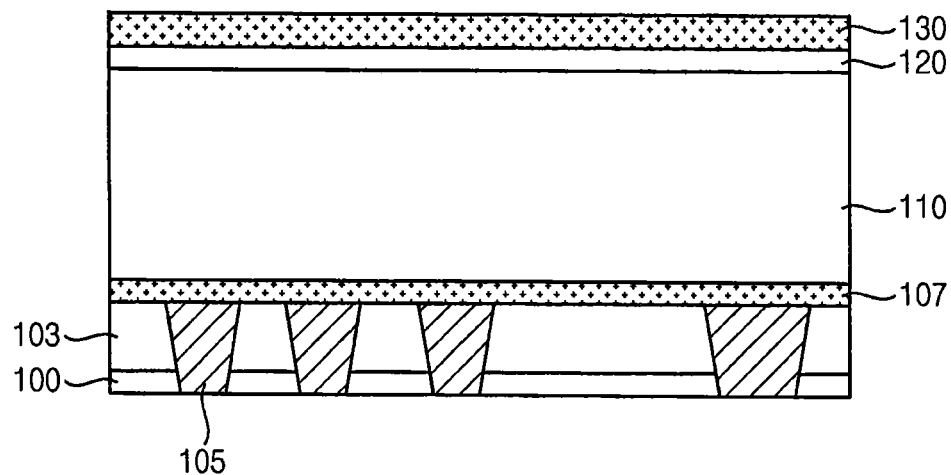

Referring to FIG. 2, a sacrificial layer 110, a buffer layer 120 and a second etch-stop layer 130 may be sequentially formed on the first etch-stop layer 107.

In example embodiments, the sacrificial layer 110 may be formed of a silicon oxide-based material doped with carbon. For example, the sacrificial layer 110 may be formed of a silicon oxide-based material including hydrocarbon groups such as alkyl groups. In some embodiments, the sacrificial layer 110 may be formed of a TEOS-based silicon oxide including, for example, TEOS, BTEOS, PTEOS or BPTEOS, or polysiloxane including alkyl substituents.

In some embodiments, the sacrificial layer 110 may be substantially formed of silicon carboxide (SiOC or SiOC:H).

In example embodiments, the sacrificial layer 110 may have different compositions at an upper portion and a lower portion thereof. For example, a carbon amount or concentration at the upper portion of the sacrificial layer 110 (adjacent the buffer layer 120) may be greater than a carbon amount or concentration at the lower portion of the sacrificial layer 110 (adjacent the first etch-stop layer 107). In some embodiments, the lower portion of the sacrificial layer 110 may include silicon oxide substantially devoid of carbon, and the upper portion of the sacrificial layer 110 may include silicon oxide doped or combined with carbon. Accordingly, a layer density at the upper portion of the sacrificial layer 110 may be less than a layer density at the lower portion of the sacrificial layer 110.

An adjustment of the composition of the sacrificial layer 110 is described in further detail with reference to FIG. 11.

The buffer layer 120 may be formed of, e.g., silicon oxynitride. The second etch-stop layer 130 may be formed as a single-layered or multi-layered structure including silicon nitride, silicon carbonitride, silicon oxynitride and/or a metal. A stress from the second etch-stop layer 130 may be absorbed or alleviated by the buffer layer 120.

The sacrificial layer 110, the buffer layer 120 and the second etch-stop layer 130 may be formed by a CVD process, a PECVD process, a sputtering process such as an ion-beam sputtering, a spin coating process, or the like.

Figure 3:
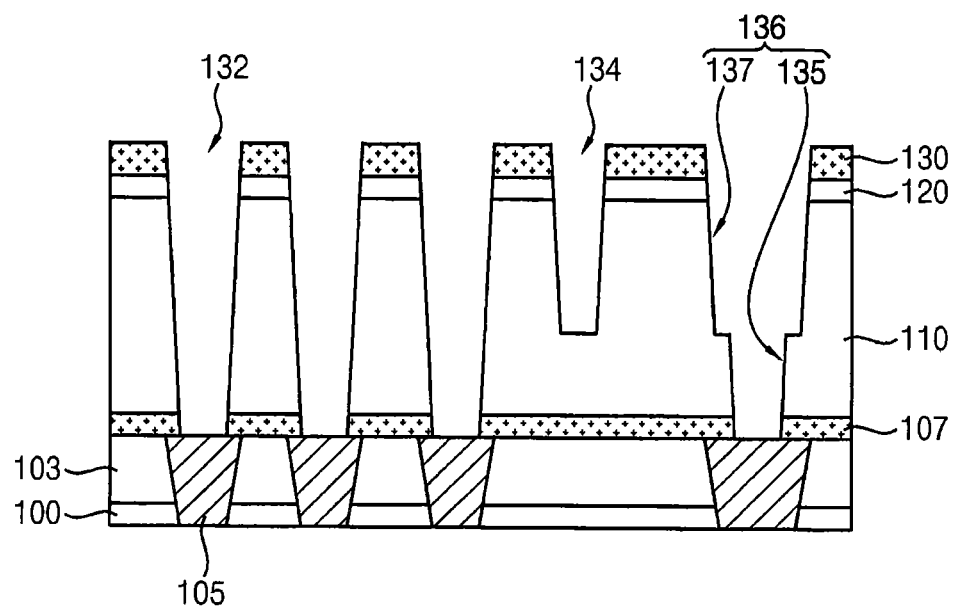

Referring to FIG. 3, the second etch-stop layer 130, the buffer layer 120 and the sacrificial layer 110 may be sequentially and partially etched to form openings.

For example, a photoresist layer may be formed on the second etch-stop layer 130, and then the photoresist layer may be partially removed by exposure and developing processes to form a mask pattern. The second etch-stop layer 130, the buffer layer 120 and the sacrificial layer 110 may be partially removed by, e.g., a dry etching process using the mask pattern to form the openings. The buffer layer 120 may also serve as an anti-reflective layer while performing the exposure process.

In some embodiments, the mask pattern may be formed using a carbon-based or silicon-based spin on hardmask (SOH) material, or a silicon oxynitride-based hardmask material.

In example embodiments, the openings may include a first opening 132, a second opening 134 and a third opening 136.

In some embodiments, the first openings 132 may extend through the sacrificial layer 110 and the first etch-stop layer 107 to expose the lower contact 105. The second opening 134 may extend through an upper portion of the sacrificial layer 110, and may not extend to a top surface of the first etch-stop layer 107. For example, the second opening 134 may have a trench shape formed at the upper portion of the sacrificial layer 110.

The third opening 136 may extend through the sacrificial layer 110 and the first etch-stop layer 107 to expose the lower contact 105, and may have a non-linear (or stepped) sidewall profile. For example, the third opening 136 may be formed by a dual damascene process. Accordingly, the third opening 136 may include a via hole 135 through which the lower contact 105 is exposed, and a trench 137 connected to an upper portion of the via hole 135.

In some embodiments, the via hole 135 extending through the sacrificial layer 110 and the first etch-stop layer 107 may be formed substantially together with the first opening 132, and a portion of the sacrificial layer 110 adjacent to an upper portion of the via hole 135 may be further etched to form the trench 137 having a width expanded from a width of the via hole 135.

For example, the second opening 134 and the trench 137 may be formed, and then the second opening 134 may be covered by a mask such that a portion of the trench 134 and a region in which the first opening 132 is formed may be exposed by the mask. Next, the first opening 132 and the via hole 135 under the trench 137 may be formed by etching the sacrificial layer 110 exposed by the mask. The trench 137 may be merged with the via hole 135.

After the formation of the openings, the mask pattern may be removed by an ashing process and/or a strip process.

Figure 4:
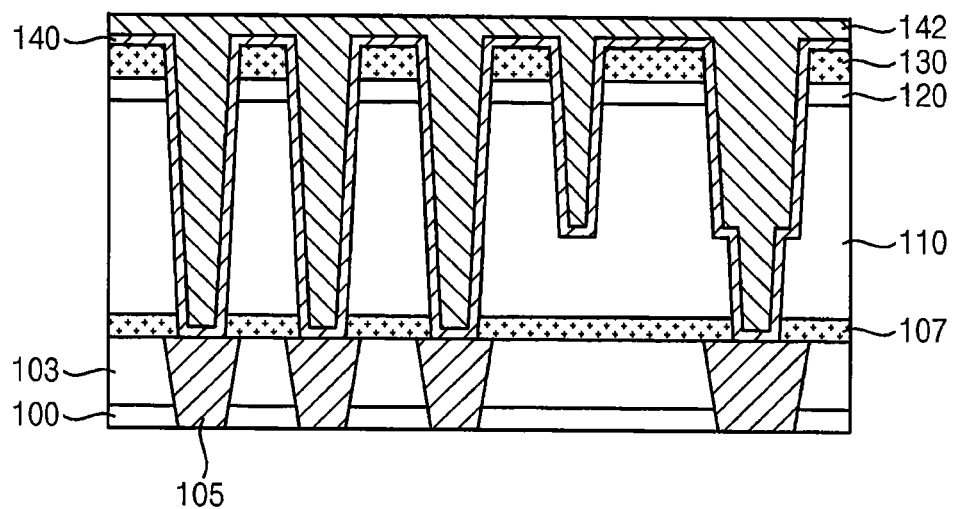

Referring to FIG. 4, a conductive layer filling the openings may be formed on the second etch-stop layer 130.

In example embodiments, a barrier layer 140 may be formed conformally along a top surface of the second etch-stop layer 130, and sidewalls and bottoms of the first to third openings 134, 134 and 136. A conductive layer 142 sufficiently filling the first to third openings 132, 134 and 136 may be formed on the barrier layer 140.

The barrier layer 140 may be formed of a metal nitride such as titanium nitride (TiNx) or tungsten nitride (WNx). The barrier layer 140 may prevent a metal ingredient included in the conductive layer 142 from being diffused into the sacrificial layer 110. The barrier layer 140 may also provide an adhesion for the formation of the conductive layer 142. The barrier layer 140 may be formed by, e.g., a sputtering process or an ALD process.

The conductive layer 142 may be formed by, e.g., an electroplating process. In this case, a seed layer may be formed conformally on the barrier layer 140 by a sputtering process using a copper target. A plating solution such as a copper sulfate solution may be prepared, and a current may be applied using the seed layer and the plating solution as a cathode and an anode, respectively. Thus, the conductive layer 142 including copper may be grown or precipitated on the seed layer through an electrochemical reaction.

In some embodiments, an annealing process may be further performed after performing the electroplating process so that a chemical structure in the conductive layer 142 may be stabilized.

In some embodiments, the conductive layer 142 may be formed by a sputtering process using a metal target such as copper, tungsten or aluminum, or an ALD process.

Figure 5:
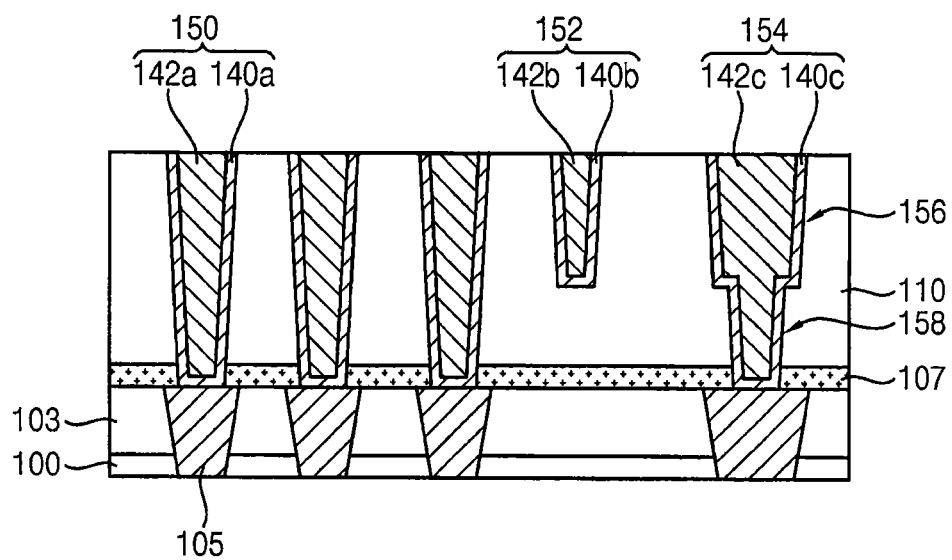

Referring to FIG. 5, upper portions of the conductive layer 142 and the barrier layer 140 may be planarized to form conductive patterns.

In example embodiments, the upper portions of the conductive layer 142 and the barrier layer 140 may be planarized by, e.g., a chemical mechanical polish (CMP) process until a top surface of the sacrificial layer 110 is exposed.

The second etch-stop layer 130 and the buffer layer 120 may be also removed by the planarization process.

Accordingly, a first conductive pattern 150, a second conductive pattern 152 and a third conductive pattern 154 may be formed in the first opening 132, the second opening 134 and the third opening 136, respectively.

The first conductive pattern 150 may include a first barrier layer pattern 140a and a first conductive layer pattern 142a, the second conductive pattern 152 may include a second barrier layer pattern 140b and a second conductive layer pattern 142b, and the third conductive pattern 154 may include a third barrier layer pattern 140c and a third conductive layer pattern 142c.

The first and third conductive patterns 150 and 154 may extend through the sacrificial layer 110 and the first etch-stop layer 107 to be in contact with the respective lower contacts 105. The second conductive pattern 152 may be buried in the upper portion of the sacrificial layer 110 and may not contact a lower contact 105.

The third conductive pattern 154 may have a non-linear (or stepped) sidewall profile. For example, a lower portion of the third conductive pattern 154 may be defined as a via portion 158, and an upper portion of the third conductive pattern 154 may be defined as an expanded portion 156 having a width greater than that of the via portion 158. For example, the expanded portion 156 may be integral with the via portion 158 (to form a unitary structure), and may extend laterally.

A stepped surface at which the sidewall profile of the third conductive pattern 154 may be non-linearly changed may be defined to be at a boundary between the via portion 158 and the expanded portion 156.

In some embodiments, a cleaning process may be further performed to remove a metal residue on the top surface of the sacrificial layer 110. In some embodiments, an ashing process may be further performed to remove the second etch-stop layer 130 and the buffer layer 120.

Figure 6:
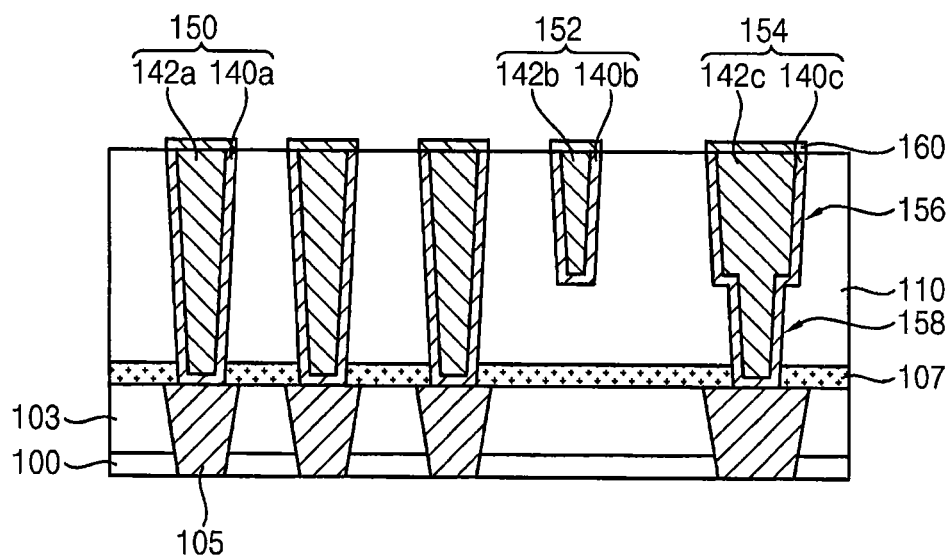

Referring to FIG. 6, a capping layer pattern 160 covering an upper surface of each conductive pattern may be formed.

The capping layer pattern 160 may include a metal which may be more chemically stable than the metal included in the first to third conductive patterns 150, 152 and 154 and may be formed by, e.g., a sputtering process or an ALD process. For example, the capping layer pattern 160 may be formed using cobalt (Co) or molybdenum (Mo). The capping layer pattern 160 may be formed of a nitride of the metal.

In example embodiments, while performing a deposition process using, e.g., cobalt or cobalt nitride, the capping layer pattern 160 may be substantially self-aligned or self-assembled with the first to third conductive patterns 150, 152 and 154 due to an affinity between metallic materials. Thus, the capping layer pattern 160 covering the first to third conductive patterns 150, 152 and 154 may be formed without an additional etching process.

In some embodiments, the capping layer pattern 160 may fully cover the upper surface of each of the first to third conductive patterns 150, 152 and 154, and may partially cover the top surface of the sacrificial layer 110. In some embodiments, an upper surface of the capping layer pattern 160 may have a curved shape or a dome shape due to properties of the self-aligned or self-assembled metallic materials In some embodiments, before the formation of the capping layer pattern 160, upper portions of the conductive patterns 150, 152 and 154 may be partially removed by, e.g., an etch-back process to form recesses. In this case, the capping layer pattern 160 may fill each recess.

Figure 7:
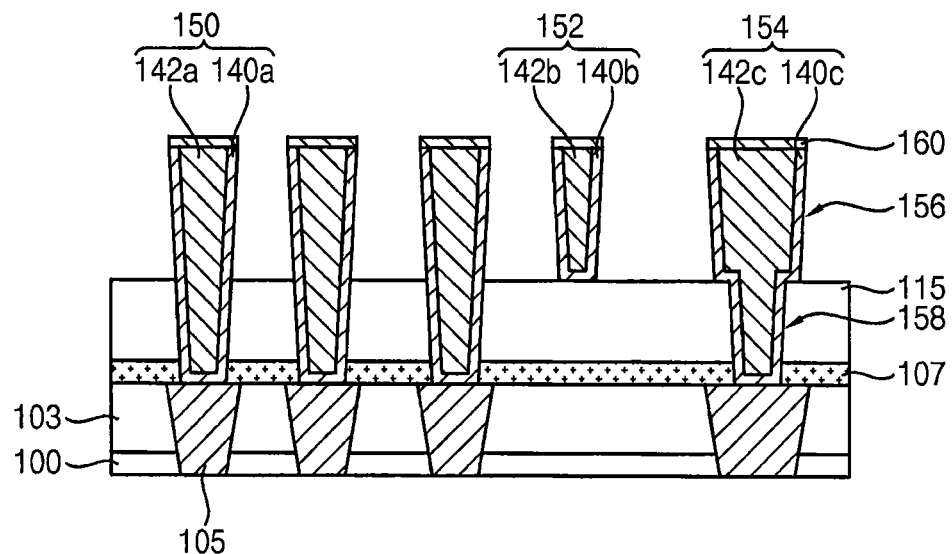

Referring to FIG. 7, an upper portion of the sacrificial layer 110 may be removed such that upper portions of the first to third conductive patterns 150, 152 and 154 may be exposed.

In some embodiments, the upper portion of the sacrificial layer 110 may be removed by a wet etching process using, e.g., a hydrofluoric acid solution or a buffer oxide etchant (BOE) solution. In some embodiments, the upper portion of the sacrificial layer 110 may be removed by an ashing process, a dry etching process using a fluoro hydrocarbon gas such as $CF_4$, $CHF_3$, or $CH_2F_2$, or a plasma etching process. In some embodiments, the removal process is defined to be one that is configured to selectively etch the sacrificial layer based on the concentration of carbon in the sacrificial layer 110.

As described above, the sacrificial layer 110 may have different compositions at the upper and lower portions thereof. For example, the upper portion of the sacrificial layer 110 may have a carbon amount (or concentration) greater than that in the lower portion. In this case, the upper portion of the sacrificial layer 110 may be easily damaged by various processes used to form the conductive patterns 150, 152 and 154 including CMP, annealing, cleaning and/or ashing processes. For example, carbon ingredients included in the upper portion of the sacrificial layer 110 may be substantially combusted so that chemical structures therein may be damaged.

Therefore, the upper portion of the sacrificial layer 110 may be selectively removed by the wet etching process or the dry etching process.

The remaining lower portion of the sacrificial layer 110 may be defined as a supporting layer 115.

In some embodiments, while removing the upper portion of the sacrificial layer 110, a bottom of the second conductive pattern 152 and/or the stepped surface of the third conductive pattern 154 may substantially serve as an etching end-point. In this case, the second conductive pattern 152 may be disposed on a top surface of the supporting layer 115, and the via portion 158 of the third conductive pattern 154 may be buried in the supporting layer 115.

Thus, bending or leaning of the first to third conductive patterns 152, 154 and 156 may be prevented by the supporting layer 115. For example, a bottom of the expanded portion 156 included in the third conductive pattern 156 may be in contact with the top surface of the supporting layer 115 so that a structural stability may be improved.

Figure 8:
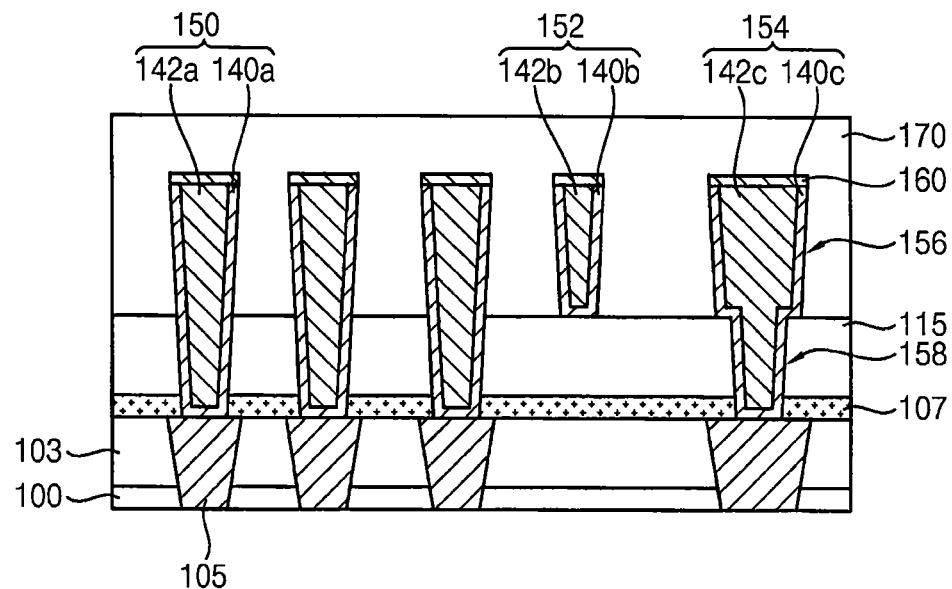

Referring to FIG. 8, an insulating interlayer 170 covering (and between) the conductive patterns 150, 152 and 154, and the capping layer pattern 160 may be formed on the supporting layer 115.

The insulating interlayer 170 may be formed of silicon oxide-based or siloxane-based materials having a low dielectric constant (low-k). For example, the insulating interlayer 170 may be formed of the silicon oxide-based material such as PEOX, TEOS, BTEOS, PTEOS, BPTEOS, BSG, PSG or BPSG.

In some embodiments, while performing a deposition process for the formation of the insulating interlayer 170, a porogen material may be provided together with a reactive gas. Accordingly, the insulating interlayer 170 may have a net structure in which oxygen atoms and carbon atoms may be combined with silicon atoms.

In some embodiments, the insulating interlayer 170 may be formed by a flowable chemical vapor deposition (FCVD) process or an ALD process having an improved gap-fill property.

Figure 9:
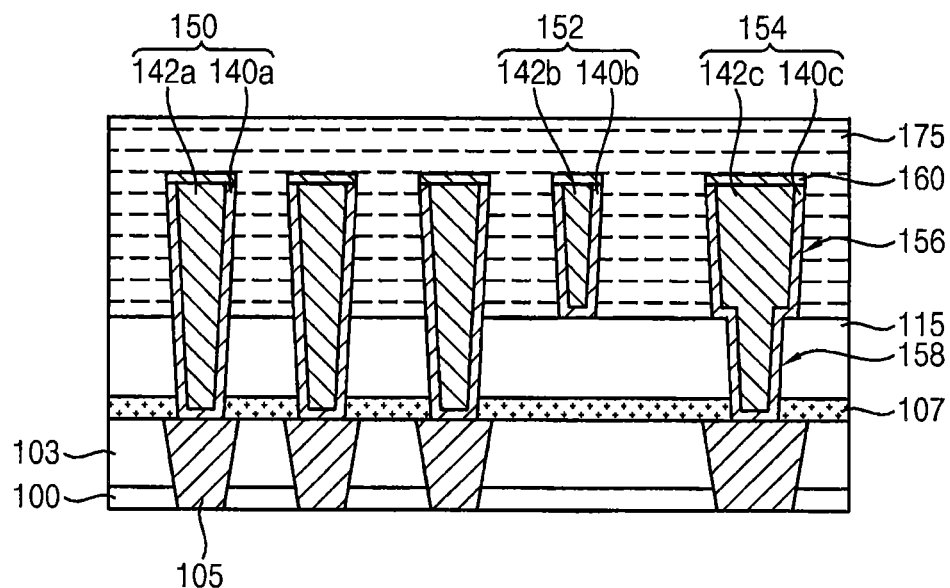

Referring to FIG. 9, a modification treatment may be performed on the insulating interlayer 170 so that the insulating interlayer 170 may be converted into a modified insulating interlayer 175.

For example, the modification treatment may include an ultraviolet (UV) irradiation or a plasma treatment. In this case, the porogen material combined or incorporated in the insulating interlayer 170 may be substantially removed so that pores may be created in the insulating interlayer 170. Thus, the modified insulating interlayer 175 may have a porous structure including the pores therein. Therefore, the dielectric constant of the insulating interlayer may be further reduced.

In some embodiments, if the conductive patterns 150, 152 and 154 are provided as uppermost wiring structures, an additional etching process or thermal treatment may not be performed so that etching damage of the insulating interlayer 170 may be avoided. Thus, a chemical structure of the insulating interlayer 170 may be intentionally modified by the above modification treatment so that a low-k insulation structure may be achieved.

Figure 10:
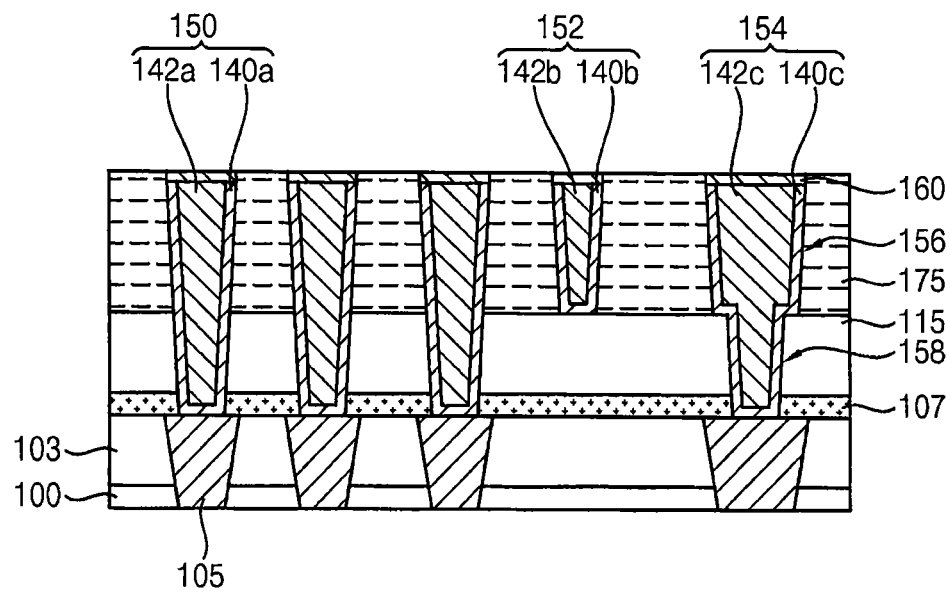

Referring to FIG. 10, an upper portion of the modified insulating interlayer 175 may be planarized by, e.g., a CMP process such that the capping layer pattern 160 may be exposed.

In some embodiments, top surfaces of the modified insulating interlayer 175 and the capping layer pattern 160 may be substantially coplanar with each other after the planarizing process. In some embodiments, the top surface of the modified insulating interlayer 175 may be lower than the top surface of the capping layer pattern 160 after the planarizing process.

According to example embodiments as described above, the sacrificial layer 110 may be formed, and then the conductive patterns 150, 152 and 154 may be formed in the sacrificial layer 110. A damaged upper portion of the sacrificial layer 110 may be removed, and a new insulating interlayer may be formed in a space from which the upper portion of the sacrificial layer 110 was removed. Thus, a low-k insulation structure free of an etching damage or a thermal damage may be formed between the conductive patterns 150, 152 and 154. Additionally, the compositions at upper and lower portions of the sacrificial layer 110 may be differentiated so that the upper portion of the sacrificial layer 110 may be selectively removed. The lower portion of the sacrificial layer 110 may remain to prevent the conductive patterns 150, 152 and 154 from bending, leaning or collapsing.

In some embodiments, additional wiring structure may be formed on the conductive patterns 150, 152 and 154. In this case, the conductive patterns 150, 152 and 154 may serve as an interconnection structure connecting upper and lower wirings to each other.

In some embodiments, as described above, the conductive patterns 150, 152 and 154 may serve as the uppermost wiring structures.

Figure 11:
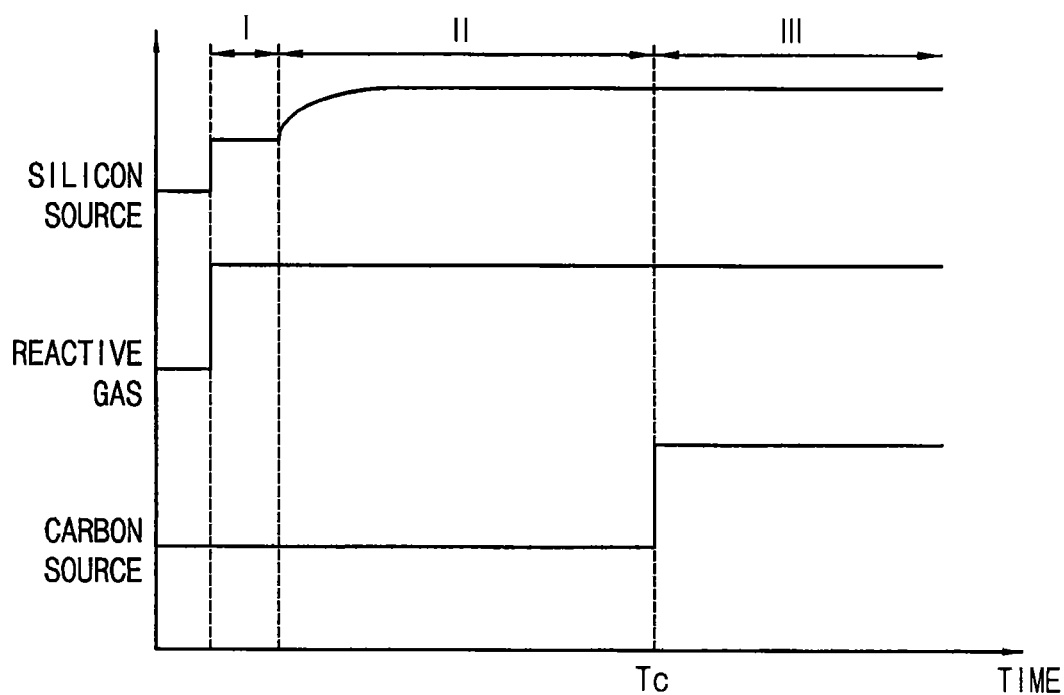

FIG. 11 is a graph showing a deposition source profile during a formation of a sacrificial layer in accordance with example embodiments.

Referring to FIG. 11, the structure illustrated in FIG. 1 may be loaded in a deposition process, and a deposition source may be introduced into the deposition chamber to form the sacrificial layer 110.

The deposition source may include a silicon source, a reactive gas and a carbon source. The silicon source may include a silicon precursor such as silane ($SiH_4$), disilane ($Si_2H_6$) or dichlorosilane ($SiH_2Cl_2$). The reactive gas may include, e.g., oxygen ($O_2$), ozone ($O_3$), or the like. The carbon source may include methane ($CH_4$), ethane ($C_2H_6$), or the like.

At an initial phase (e.g., a phase I shown in FIG. 11), a slight amount of the silicon source and the reactive gas may be introduced together so that a silicon oxide layer may be formed on the first etch-stop layer 107. After a specific period (e.g., from a phase II), an amount of the silicon source may be gradually increased to form a transition layer. After the formation of the transition layer, a flow rate of the silicon source may be steadily maintained. A flow rate of the reactive gas may be steadily maintained from the initial phase.

At a time Tc (e.g., at the beginning of phase III), the carbon source may be first initiated. Accordingly, carbon may be doped in the silicon oxide layer, or silicon carboxide may be created so that the sacrificial layer 110 may be formed.

In some embodiments, after the time Tc, flow rates of the silicon source, the reactive gas and the carbon source may be constantly and uniformly provided.

In some embodiments, an introduction of the carbon source may be initiated together with the reactive gas, and the flow rate of the carbon source may be gradually increased. In this case, a carbon concentration in the sacrificial layer 110 may be increased from a lower portion to an upper portion.

As described above, the time at which the carbon source may be introduced may be controlled, so that the composition of the sacrificial layer 110 may be adjusted at the lower and upper portions thereof. Further, a thickness or a height of the upper portion that may be removed may be controlled by an adjustment of the time Tc.

Figure 12:
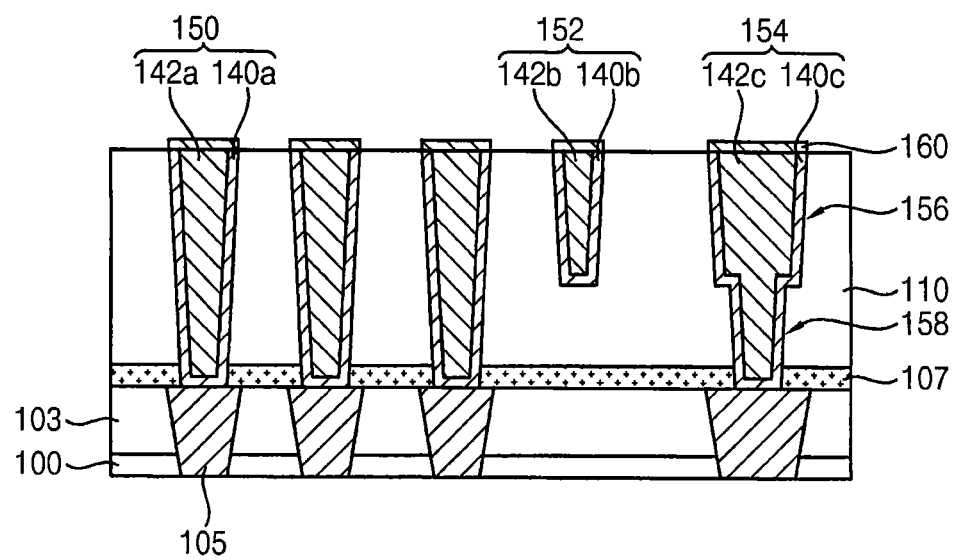
Figure 13:
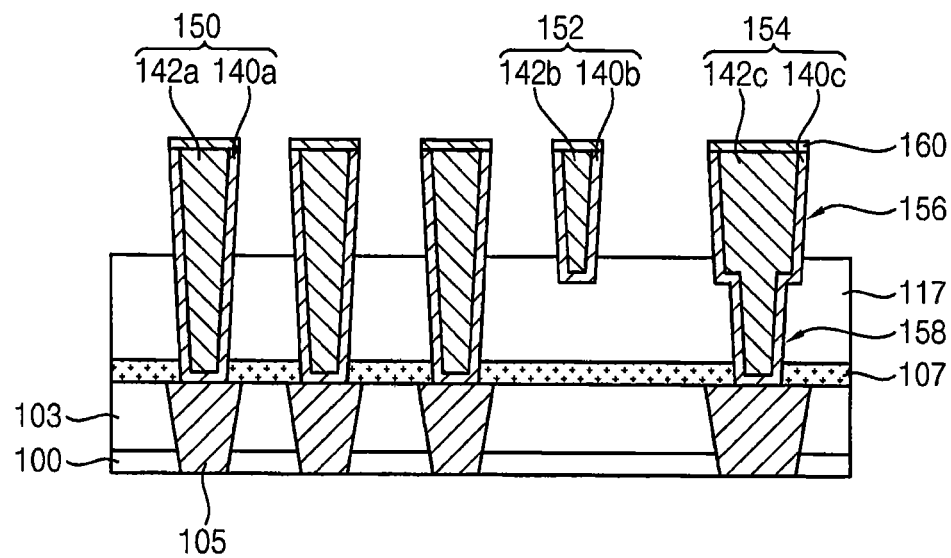
Figure 14:
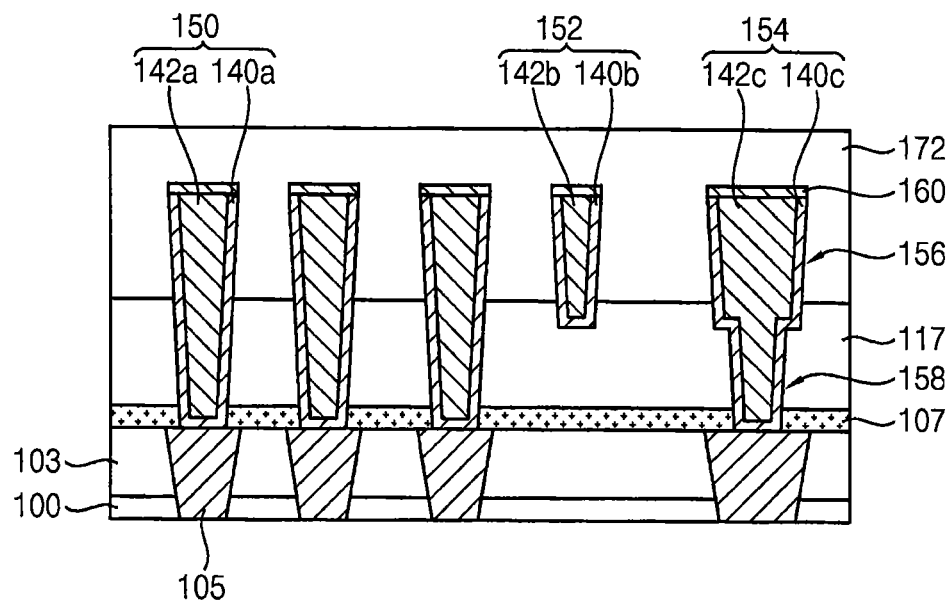

FIGS. 12 to 14 are cross-sectional views illustrating a method of forming a conductive structure in accordance with example embodiments. Detailed descriptions on processes and/or materials substantially the same as or similar to those illustrated with reference to FIGS. 1 to 10 may be omitted herein.

Referring to FIG. 12, processes substantially the same as or similar to FIGS. 1 to 6 may be performed.

In example embodiments, a sacrificial layer 110 covering a lower insulation layer 103 and lower contacts 105 may be formed on a first etch-stop layer 107, and first to third conductive patterns 150, 152 and 154 may be formed in the sacrificial layer 110. The first and third conductive patterns 150 and 154 may be formed through the sacrificial layer 110 and the first etch-stop layer 107 to be in contact with the respective lower contacts 105. The second conductive pattern 152 may be buried in an upper portion of the sacrificial layer 110 so as not to contact the lower contact 105. The third conductive pattern 154 may include a via portion 158 and an expanded portion 156. A capping layer pattern 160 covering an upper surface of each of the conductive patterns 150, 152 and 154 may be formed.

Referring to FIG. 13, a process substantially similar to that illustrated with reference to FIG. 7 may be performed. In example embodiments, an upper portion of the sacrificial layer 110 may be removed such that upper portions of the first to third conductive patterns 150, 152 and 154 may be exposed. A remaining portion of the sacrificial layer 110 may be defined as a supporting layer 117.

In example embodiments, a lower portion of the second conductive pattern 152, the via portion 158 of the third conductive pattern 154, and a lower portion of the expanded portion 156 may be buried in the supporting layer 117. In this case, the sacrificial layer 110 may be removed such that a bottom of the second conductive pattern 152 and/or a stepped surface of the third conductive pattern 154 may not be exposed. Thus, an upper surface of the supporting layer 117 may be higher than the bottom of the second conductive pattern 152 and/or the stepped surface of the third conductive pattern 154.

Accordingly, the second conductive pattern 152 and the expanded portion 156 of the third conductive pattern 154 may be partially buried in the supporting layer 117. Therefore, a structural stability of the second conductive pattern 152 and the third conductive pattern 154 may be further improved.

Referring to FIG. 14, a process substantially the same as or similar to that illustrated with reference to FIG. 8 may be performed. Thus, an insulating interlayer 172 covering (and between) the conductive patterns 150, 152 and 154, and the capping layer pattern 160 may be formed on the supporting layer 117.

Subsequently, as illustrated with reference to FIGS. 9 and 10, the insulating interlayer 172 may be converted into a modified insulating interlayer through a modification treatment. The modified insulating interlayer may be planarized until the capping layer pattern 160 may be exposed.

FIGS. 15 to 21 are cross-sectional views illustrating a method of forming a conductive structure in accordance with example embodiments. Detailed descriptions on processes and/or materials substantially the same as or similar to those illustrated with reference to FIGS. 1 to 10 may be omitted herein.

Figure 15:
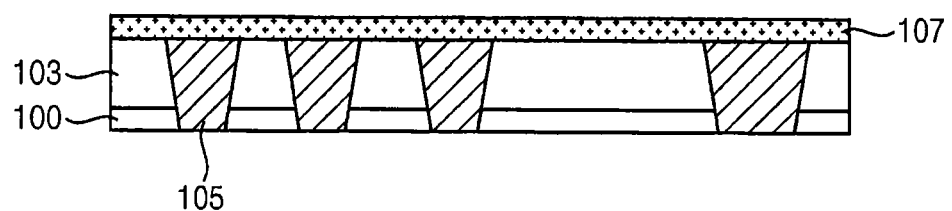

Referring to FIG. 15, and as also illustrated with reference to FIG. 1, a lower insulation layer 103 may be formed on the passivation layer 100, and lower contacts 105 extending through the lower insulation layer 103 and the passivation layer 100 may be formed. A first etch-stop layer 107 covering the lower contacts 105 may be formed on the lower insulation layer 103.

Figure 16:
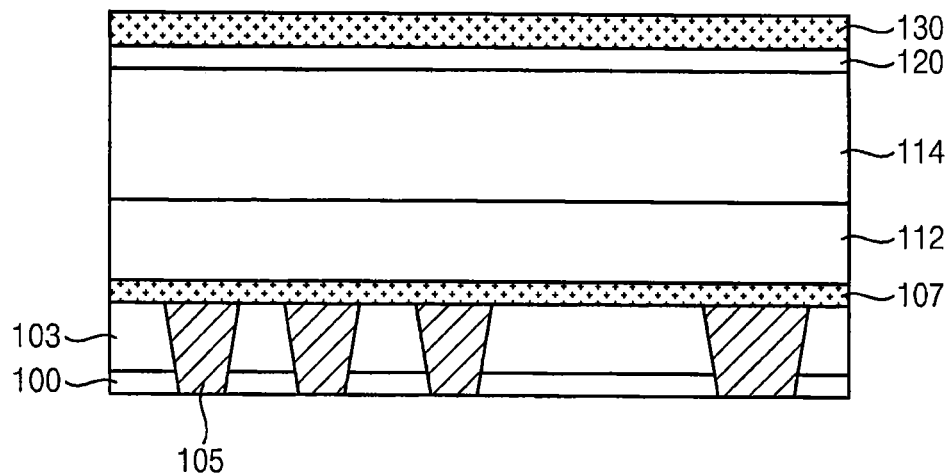

Referring to FIG. 16, a supporting layer 112 and a sacrificial layer 114 may be sequentially formed on the first etch-stop layer 107. A buffer layer 120 and a second etch-stop layer 130 may be sequentially formed on the sacrificial layer 114.

In example embodiments, the supporting layer 112 may be formed of a low-k silicon oxide-based or siloxane-based material. The sacrificial layer 114 may be formed of silicon oxide doped with carbon or silicon carboxide.

In some embodiments, the supporting layer 112 and the sacrificial layer 114 may be formed in-situ in a deposition chamber for a CVD process or an ALD process. For example, as illustrated in FIG. 11, a silicon source and a reactive gas may be provided in the deposition chamber to form the supporting layer 112 substantially including silicon oxide.

A time at which the formation of the supporting layer 112 is completed may be set as a time Tc, and a carbon source may be provided after the time Tc. Thus, the sacrificial layer 114 substantially including silicon carboxide or silicon oxide doped with carbon may be obtained.

Figure 17:
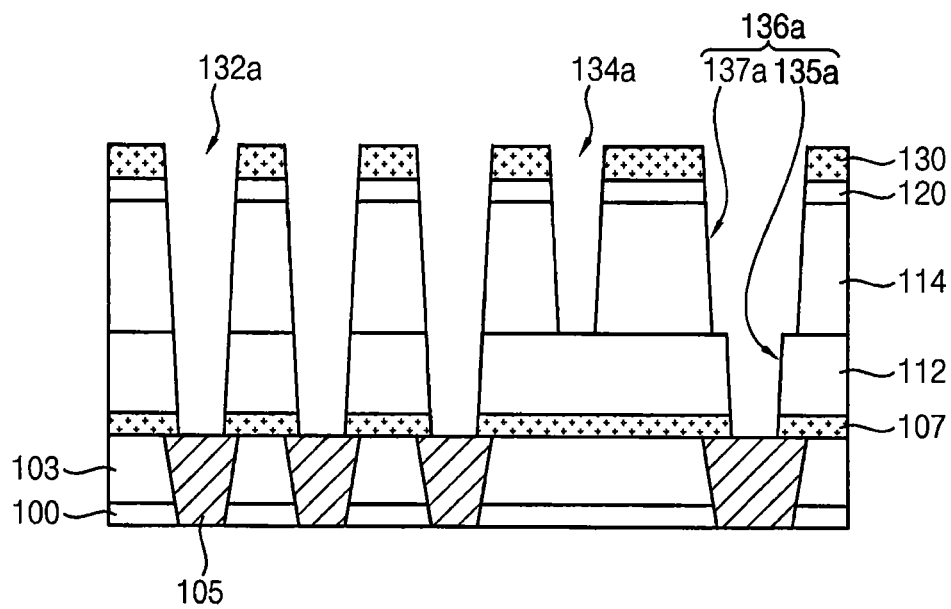

Referring to FIG. 17, a process substantially the same as or similar to that illustrated with reference to FIG. 3 may be performed to form first to third openings 132a, 134a and 136a.

In example embodiments, the first and third openings 132a and 136a may extend through the second etch-stop layer 130, the buffer layer 120, the sacrificial layer 114, the supporting layer 112 and the first etch-stop layer 107. A top surface of the lower contact 105 may be exposed through the first and third openings 132a and 136a.

The second opening 134a may extend through the second etch-stop layer 130, the buffer layer 120 and the sacrificial layer 114. A top surface of the supporting layer 112 may be exposed through second opening 134a.

The third opening 136a may include a via hole 135a, and a trench 137a expanded from an upper portion of the via hole 135a. In example embodiments, a boundary between the via hole 135a and the trench 137 may be defined substantially by the top surface of the supporting layer 112.

In example embodiments, the top surface of the supporting layer 112 may substantially serve as an etch-stop surface while performing an etching process for the formation of the second opening 134a and the trench 137a. For example, a plasma etching process may be performed for the formation of the second opening 134a and the trench 137a. The sacrificial layer 114 having a relatively great amount of carbon may be easily damaged and etched by the plasma etching process. Thus, the etching process may be performed until the supporting layer 112 which may have a relatively small amount of carbon, or may be substantially carbon-free is exposed.

Figure 18:
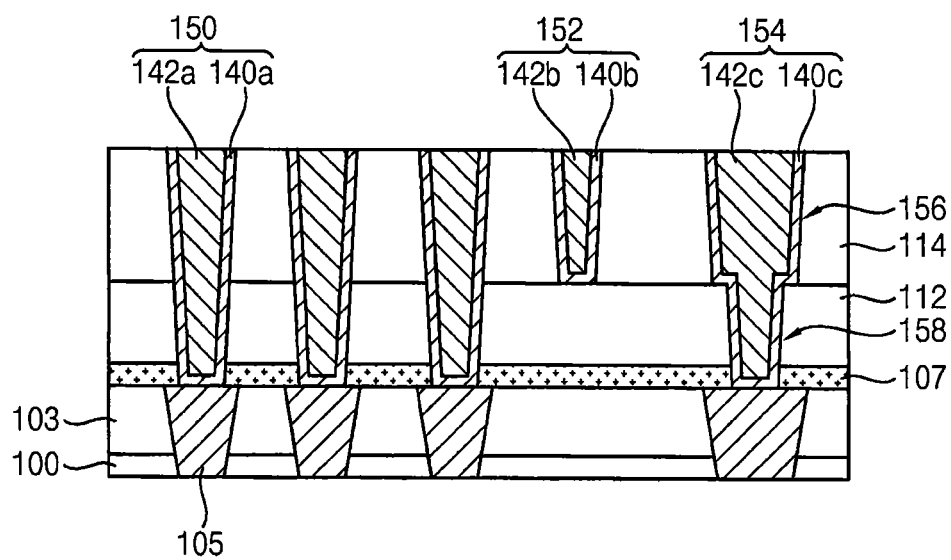

Referring to FIG. 18, processes substantially the same as or similar to those illustrated with reference to FIGS. 4 and 5 may be performed.

Accordingly, a first conductive pattern 150, a second conductive pattern 152 and a third conductive pattern 154 may be formed in the first opening 132a, the second opening 134a and the third opening 136a, respectively. The first conductive pattern 150 may include a first barrier layer pattern 140a and a first conductive layer pattern 142a. The second conductive pattern 152 may include a second barrier layer pattern 140b and a second conductive layer pattern 142b. The third conductive pattern 154 may include a third barrier layer pattern 140c and a third conductive layer pattern 142c.

In example embodiments, the first conductive pattern 150 and the third conductive pattern 154 may extend through the sacrificial layer 114, the supporting layer 112 and the first etch-stop layer 107 to be in contact with the respective lower contact 105. The second conductive pattern 152 may extend through the sacrificial layer 114, and may be in contact with the top surface of the supporting layer 112. For example, the second conductive pattern 152 may be landed on the top surface of the supporting layer 112.

The third conductive pattern 154 may include a via portion 158 and an expanded portion 156. A stepped surface between the via portion 158 and the expanded portion 156 may be defined by the top surface of the supporting layer 112.

Figure 19:
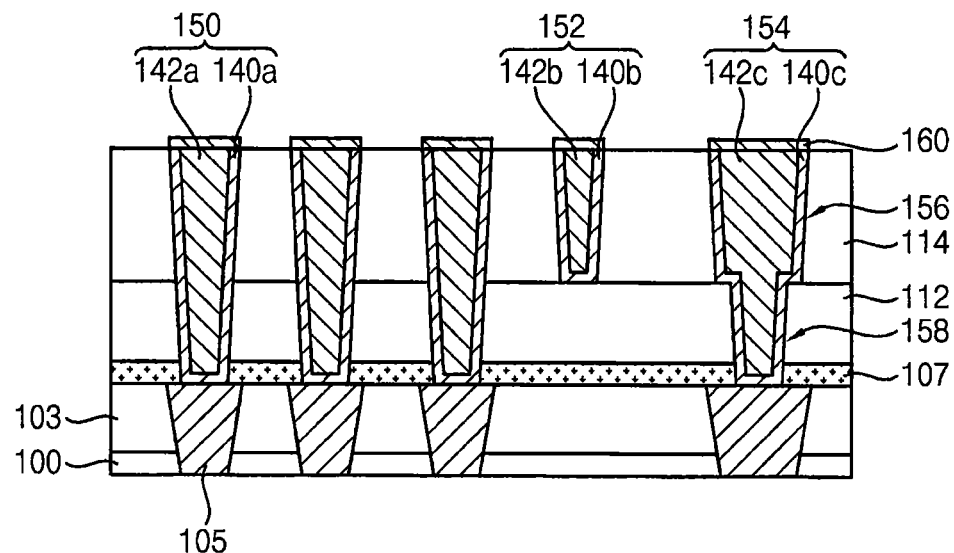

Referring to FIG. 19, a process substantially the same as or similar to that illustrated with reference to FIG. 6 may be performed to form a capping layer pattern 160 covering a top surface of each conductive pattern 150, 152 and 154.

Figure 20:
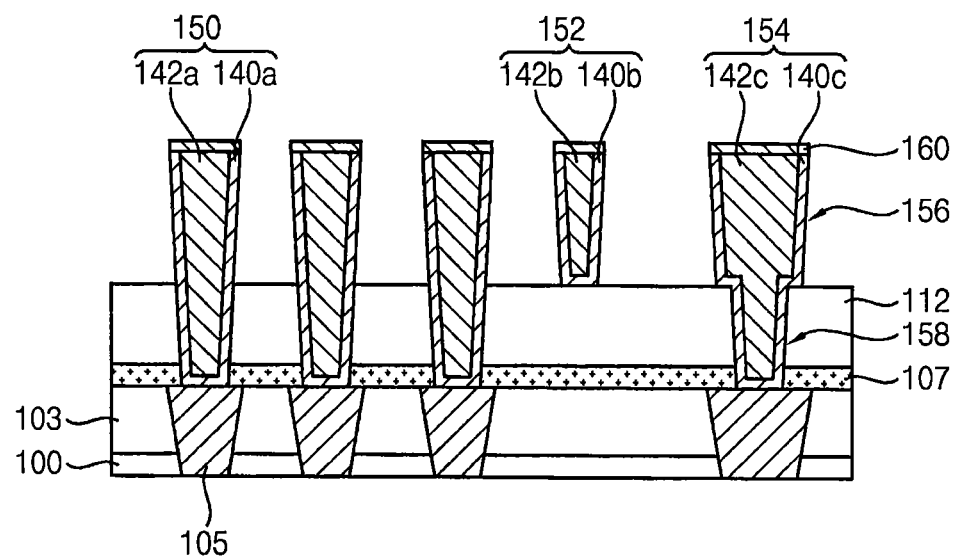

Referring to FIG. 20, the sacrificial layer 114 may be removed such that upper portions of the conductive patterns 150, 152 and 154 may be exposed. After the removal of the sacrificial layer 114, the top surface of the supporting layer 112 may be also exposed.

For example, the sacrificial layer 114 may be removed by an ashing process, a dry etching process using a fluoro hydrocarbon gas such as $CF_4$, $CHF_3$, or $CH_2F_2$, a plasma etching process, or a wet etching process using hydrofluoric acid solution or a BOE solution. The sacrificial layer 114 may be damaged during the processes for the formation of the conductive patterns 150, 152 and 154 and/or the capping layer pattern 160, and thus may be easily removed.

In some embodiments, before the removal of the sacrificial layer 114, a plasma treatment may be further performed on the sacrificial layer 114. For example, a reductive reaction gas such as ammonia ($NH_3$), nitrogen ($N_2$) or hydrogen ($H_2$) may be used as part of a reductive plasma treatment of the sacrificial layer 114.

In this case, carbon ingredients in the sacrificial layer 114 may be reduced so that an inner structure of the sacrificial layer 114 may be damaged. Thus, the sacrificial layer 114 may be removed more easily by the etching process.

As illustrated in FIG. 20, the bottom of the second conductive pattern 152 may be supported by the top surface of the supporting layer 112. The via portion 158 of the third conductive pattern 154 may be buried in the supporting layer 112 so that a structural stability of the third conductive pattern 154 may be enhanced.

Figure 21:
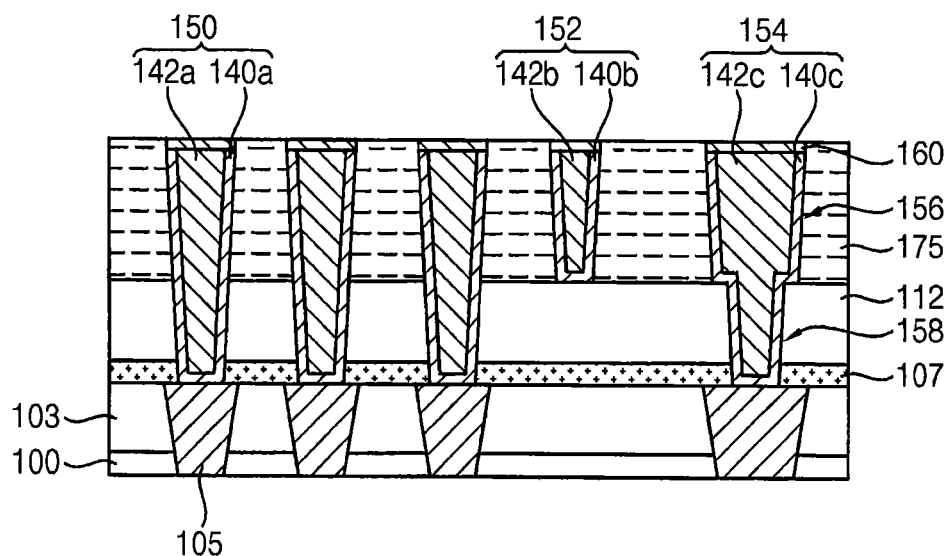

Referring to FIG. 21, processes substantially the same as or similar to those illustrated with reference to FIGS. 8 to 10 may be performed.

In example embodiments, an insulating interlayer covering the conductive patterns 150, 152 and 154 may be formed, and the insulating interlayer may be converted into a modified insulating interlayer 175. Accordingly, a dielectric constant of an insulation structure between the conductive patterns 150, 152 and 154 may be further reduced. An upper portion of the modified insulating interlayer 175 may be planarized until a top surface of the capping layer pattern 160 is exposed.

FIGS. 22 to 25 are cross-sectional views illustrating a method of forming a conductive structure in accordance with example embodiments.

Detailed descriptions on processes and/or materials substantially the same as or similar to those illustrated with reference to FIGS. 1 to 10, or FIGS. 15 to 21 may be omitted herein.

Figure 22:
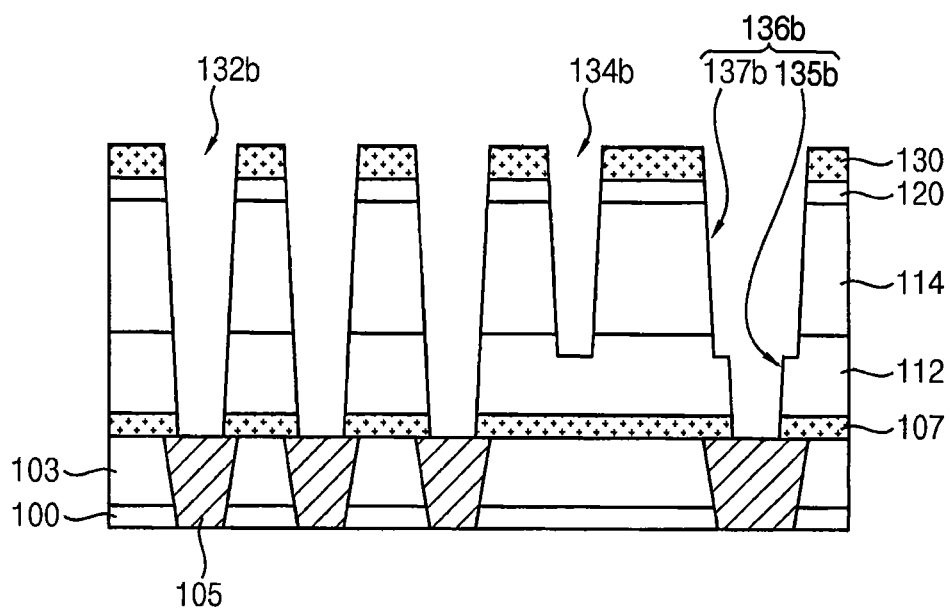

Referring to FIG. 22, processes substantially the same as or similar to FIGS. 15 to 17 may be performed to form first to third openings 132b, 134b and 136b.

The first opening 132b may have a shape or a structure substantially the same as that of the first opening 132a illustrated in FIG. 17.

The second opening 134b may extend through a second etch-stop layer 130, a buffer layer 120 and a sacrificial layer 114, and may extend in an upper portion of a supporting layer 112.

The third opening 136b may include a via hole 135b and a trench 137b. The trench 137b may extend through the second etch-stop layer 130, the buffer layer 120 and the sacrificial layer 114, and may extend in the upper portion of the supporting layer 112 to be integrally connected to the via hole 135b.

As described above, the upper portion of the supporting layer 112 may be additionally etched while forming the second opening 134b and the trench 137b such that heights of the second opening 134b and the trench 137b may be increased.

Figure 23:
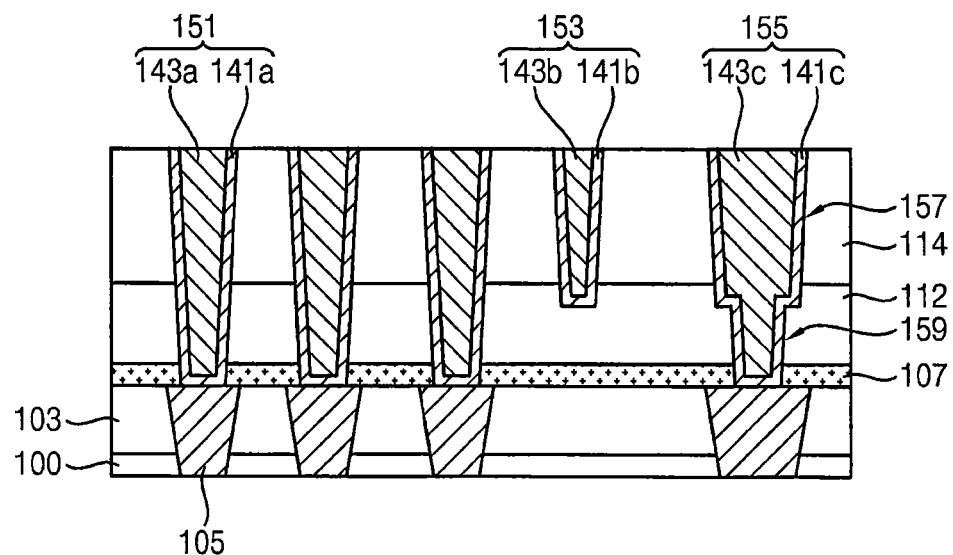

Referring to FIG. 23, processes substantially the same as or similar to those illustrated with reference to FIGS. 4 and 5, or FIG. 18 may be performed. Accordingly, a first conductive pattern 151, a second conductive pattern 153 and a third conductive pattern 155 may be formed in the first opening 132b, the second opening 134b and the third opening 136b, respectively.

The first conductive pattern 151 may include a first barrier layer pattern 141a and a first conductive layer pattern 143a. The second conductive pattern 153 may include a second barrier layer pattern 141b and a second conductive layer pattern 143b. The third conductive pattern 155 may include a third barrier layer pattern 141c and a third conductive layer pattern 143c.

The first and third conductive patterns 151 and 155 may extend through the sacrificial layer 114, the supporting layer 112 and a first etch-stop layer 107, and may be in contact with lower contacts 105.

The second conductive pattern 153 may extend through the sacrificial layer 114, and may be partially inserted or buried in the upper portion of the supporting layer 112.

The third conductive pattern 155 may include a via portion 159 and an expanded portion 157. The via portion 159 may be buried in the supporting layer 112. The expanded portion 157 may extend through the sacrificial layer 114, and may extend through the upper portion of the supporting layer 112 to be integrally connected to the via portion 159.

Figure 24:
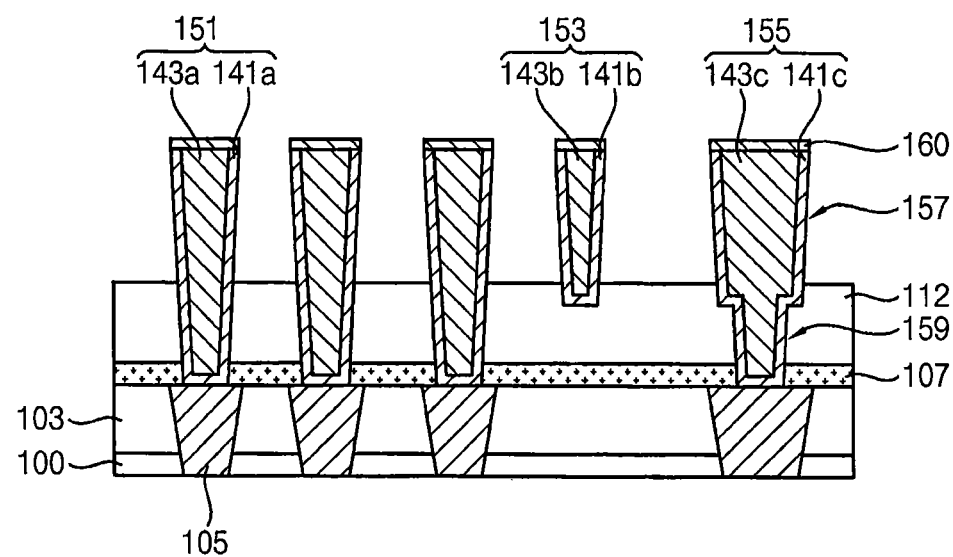

Referring to FIG. 24, processes substantially the same as or similar to those illustrated with reference to FIGS. 19 and 20 may be performed. Accordingly, a capping layer pattern 160 covering each of the conductive patterns 151, 153 and 155 may be formed, and the sacrificial layer 114 may be removed.

After the removal of the sacrificial layer 114, upper portions of the conductive patterns 151, 153 and 155, and a top surface of the supporting layer 112 may be exposed. A lower portion of the second conductive pattern 153, and the expanded portion 157 of the third conductive pattern 155 may be embedded in the supporting layer 112, so that structural stability of the second and third conductive patterns 153 and 155 may be improved.

Figure 25:
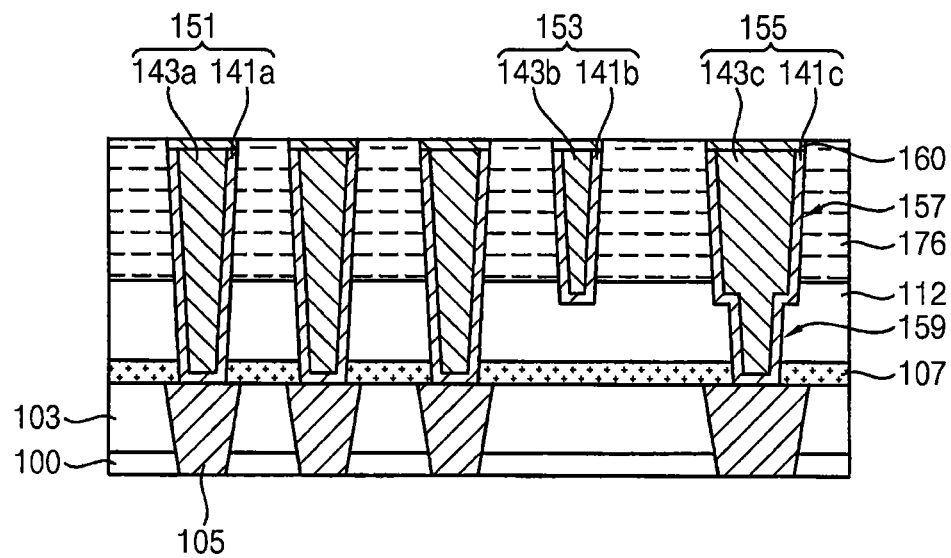

Referring to FIG. 25, processes substantially the same as or similar to FIGS. 8 to 10, or FIG. 21 may be performed.

In example embodiments, an insulating interlayer covering the conductive patterns 151, 153 and 155 may be formed on the supporting layer 112. The insulating interlayer may be converted into a modified insulating interlayer 176 through a modification treatment. Accordingly, a dielectric constant of an insulation structure between the conductive patterns 151, 153 and 155 may be further reduced. An upper portion of the modified insulating interlayer 176 may be planarized until a top surface of the capping layer pattern 160 is exposed.

FIGS. 26 to 35 are cross-sectional views illustrating a method of manufacturing a semiconductor device in accordance with example embodiments. Detailed descriptions on processes and/or materials substantially the same as or similar to those illustrated with reference to FIGS. 1 to 10, FIGS. 12 to 14, FIGS. 15 to 21 and/or FIGS. 22 to 25 are omitted herein.

Figure 26:
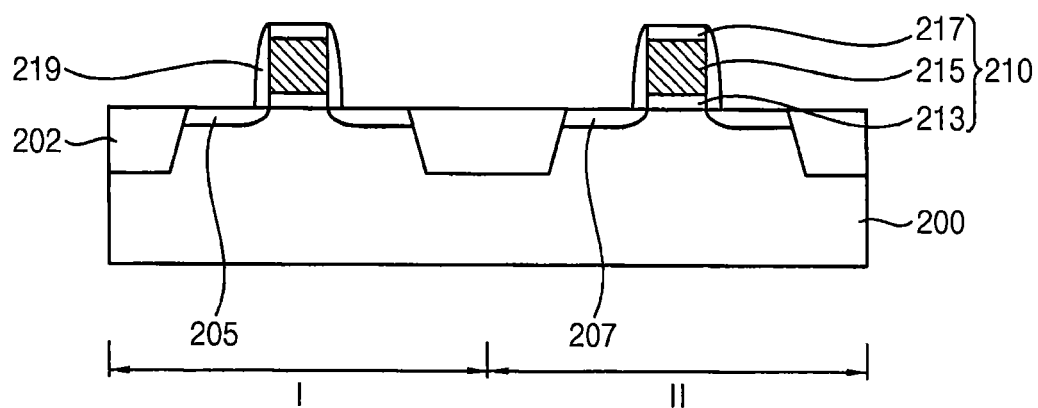

Referring to FIG. 26, a front-end-of-line (FEOL) process may be performed on a substrate 200.

In example embodiments, a gate structure 210 may be formed on a substrate 200, and impurity regions 205 and 207 may be formed on upper portions of the substrate 200 adjacent to the gate structure 210.

The substrate 200 may include a first region I and a second region II. For example, the first region I and the second region II may be provided as an NMOS (n-type metal oxide semiconductor) region and a PMOS (p-type metal oxide semiconductor) region, respectively. In this case, p-type impurities may be implanted in the first region I to form a P-well, and n-type impurities may be implanted in the second region II to form an N-well.

The substrate 200 may include a semiconductor substrate, e.g., a silicon substrate, a germanium substrate, a silicon-germanium substrate, a silicon-on-insulator (SOI) substrate, a germanium-on-insulator (GOI) substrate, etc. In some embodiments, the substrate 200 may include a group III-V compound such as GaP, GaAs, GaSb, or the like.

An isolation layer 202 may be formed by a shallow trench isolation (STI) process. The substrate 200 may be divided into an active region and a field region by the isolation layer 202.

A gate insulation layer, a gate electrode layer and a gate mask layer may be sequentially formed on the substrate 200, and may be patterned by a photolithography process to form the gate structure including a gate insulation layer pattern 213, a gate electrode 215 and a gate mask 217.

The gate insulation layer may be formed of silicon oxide or metal oxide. In some embodiments, the gate insulation layer may be formed by performing a thermal oxidation process on a top surface of the substrate 200. The gate electrode layer may be formed of doped polysilicon, metal, metal nitride or metal silicide. The gate mask layer may be formed of silicon nitride. The gate insulation layer, the gate electrode layer and the gate mask layer may be formed by, e.g., a CVD process, a PVD process, an ALD process, or the like.

Impurities may be implanted using the gate structure 210 as an ion-implantation mask to form a first impurity region 205 and a second impurity region 207 at upper portions of the substrate 200 in the first region I and the second region II, respectively. In example embodiments, the first impurity region 205 may include n-type impurities such as phosphorous (P) or arsenic (As), and the second impurity region 207 may include p-type impurities such as boron (B).

In this case, a first photoresist mask covering the second region II of the substrate 200 may be formed, and the n-type impurities may be implanted on the first region I to form the first impurity region 205. The first photoresist mask may be removed by an ashing process and/or a strip process. A second photoresist mask covering the first region I of the substrate 200 may be formed, the p-type impurities may be implanted on the second region II to form the second impurity region 207. The second photoresist mask may be removed by an ashing process and/or a strip process.

Accordingly, an NMOS transistor may be defined by the first impurity region 205 and the gate structure 210 on the first region I. A PMOS transistor may be defined by the second impurity region 207 and the gate structure 210 on the second impurity region II. Thus, a CMOS (complementary metal oxide semiconductor) transistor may be formed on the substrate 200.

A gate spacer 219 may be further formed on a sidewall of the gate structure 210. For example, a spacer layer covering the gate structure 210 may be formed on the substrate 200. The spacer layer may be anisotropically etched to form the gate spacer 219. The spacer layer may be formed on silicon nitride by a CVD process or an ALD process.

Figure 27:
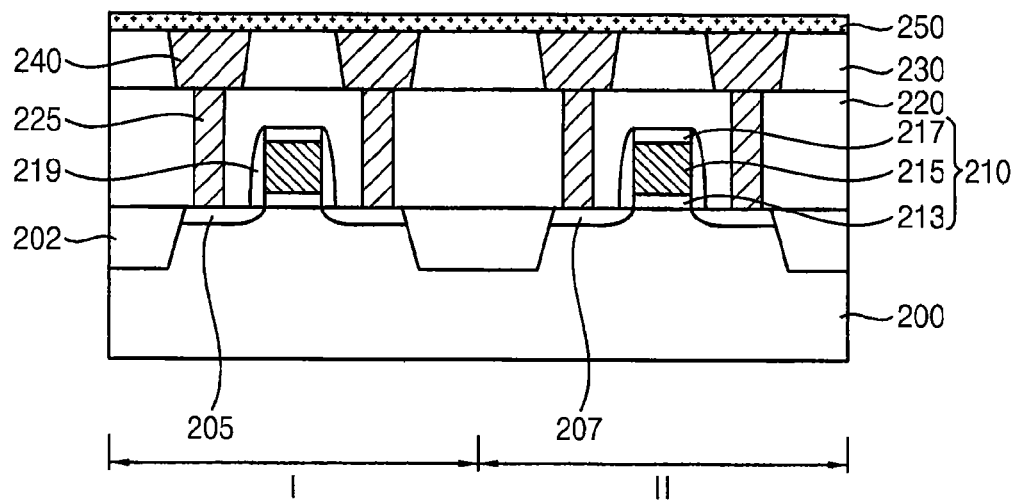

Referring to FIG. 27, a first lower insulation layer 220 covering the transistor may be formed on the substrate 200, and plugs 225 electrically connected to the impurity regions 205 and 207 may be formed through the first lower insulation layer 220.

Subsequently, a back-end-of-line (BEOL) process may be performed to form an interconnection structure electrically connected to the plugs 225.

A second lower insulation layer 230 covering the plugs 225 may be formed on the first lower insulation layer 220, and lower contacts 240 electrically connected to the plugs 225 may be formed in the second lower insulation layer 230. A first etch-stop layer 250 covering the lower contacts 240 may be formed on the second lower insulation layer 230.

The first and second lower insulation layers 220 and 230 may be formed of silicon oxide. The plugs 225 and the lower contacts 240 may be formed of a metal such as copper or tungsten. The first etch-stop layer 250 may be formed of silicon nitride, silicon carbonitride, silicon oxynitride and/or a metal.

In some embodiments, a passivation layer including, e.g., silicon nitride may be formed between the first and second lower insulation layers 220 and 230.

Figure 28:
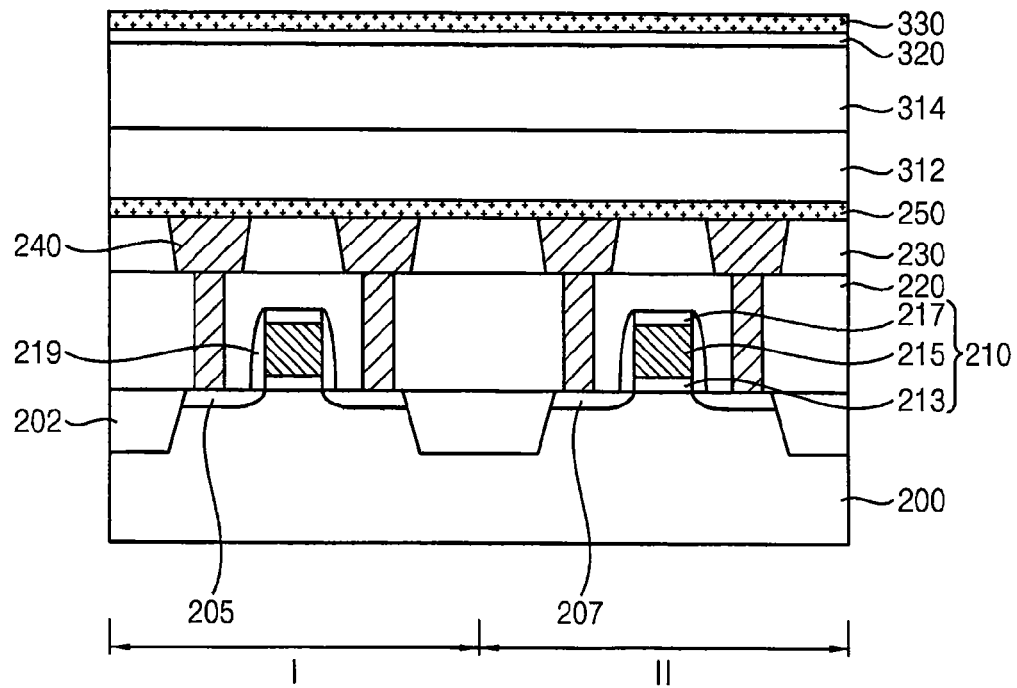

Referring to FIG. 28, a process substantially the same as or similar to that illustrated with reference to FIG. 16 may be performed.

Accordingly, a supporting layer 312, a sacrificial layer 314, a buffer layer 320 and a second etch-stop layer 330 may be sequentially formed on the first etch-stop layer 250.

Figure 29:
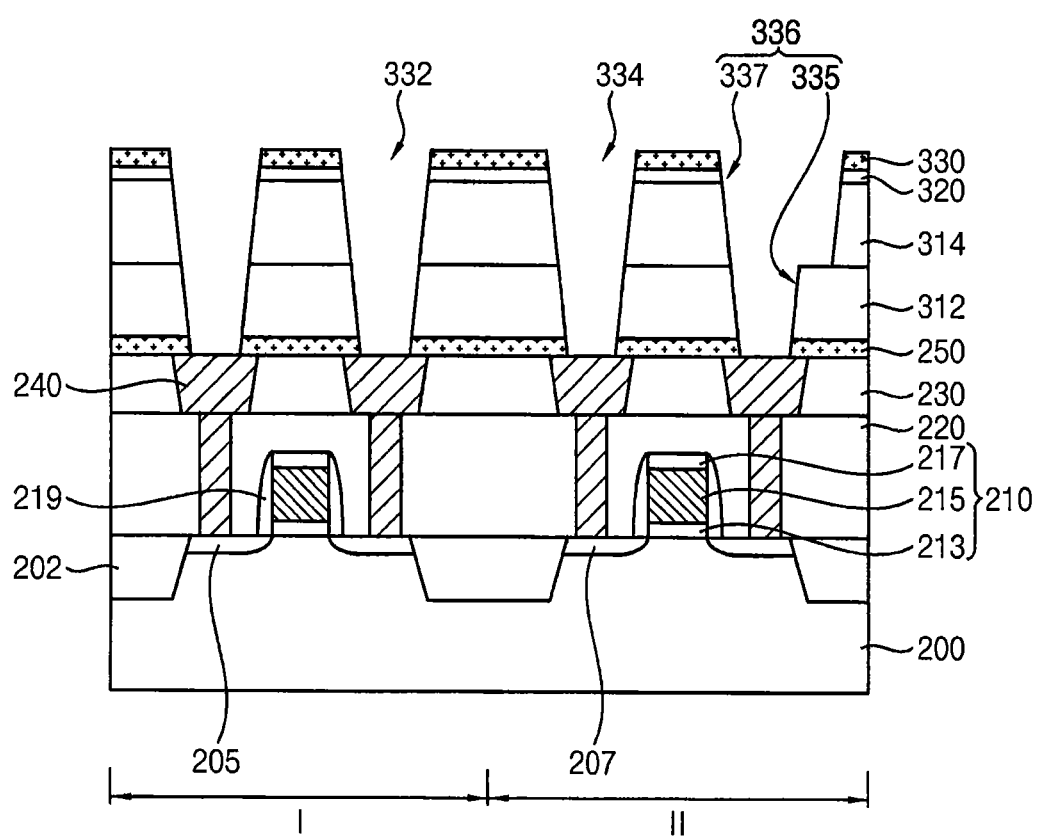

Referring to FIG. 29, a process substantially the same as or similar to that illustrated with reference to FIG. 17 may be performed. In example embodiments, a first opening 322, a second opening 334 and third opening 336 may be formed through the second etch-stop layer 330, the buffer layer 320, the sacrificial layer 314, the supporting layer 312 and the first etch-stop layer 250 such that the respective lower contacts 240 may be exposed.

For example, the lower contact 240 electrically connected to the first impurity region 205 may be exposed through the first opening 332. The lower contact 240 electrically connected to the second impurity region 207 may be exposed through the second opening 334.

In some embodiments, the third opening 336 may be formed by a dual damascene process, and may include a via hole 335 and a trench 337. The trench 337 may be integrally connected to an upper portion of the via hole 335, and may have a width expanded from a width of the via hole 335. A boundary between the via hole 335 and the trench 337 may be defined by a top surface of the supporting layer 312.

Figure 30:
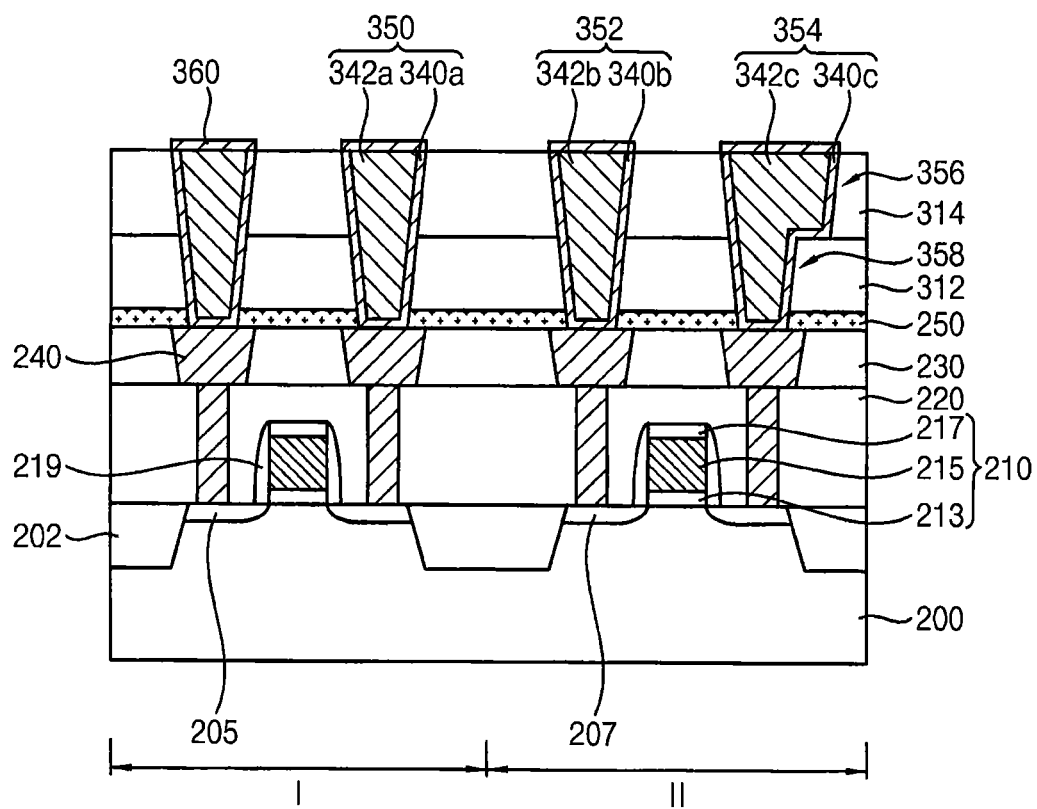

Referring to FIG. 30, processes substantially the same as or similar to FIGS. 18 and 19 may be performed.

Accordingly, a first conductive pattern 350, a second conductive pattern 352 and a third conductive pattern 354 may be formed in the first opening 322, the second opening 334 and the third opening 336, respectively.

The first conductive pattern 350 may include a first barrier layer pattern 340a and a first conductive layer pattern 342a. The second conductive pattern 352 may include a second barrier layer pattern 340b and a second conductive layer pattern 342b. The third conductive pattern 354 may include a third barrier layer pattern 340c and a third conductive layer pattern 342c.

The third conductive pattern 354 may include a via portion 358 formed in the via hole 335, and an expanded portion 356 formed in the trench 337. A boundary or a stepped surface between the via portion 358 and the expanded portion 356 may be defined by the top surface of the supporting layer 312.

For example, the expanded portion 356 may serve as a routing wiring extending from the via portion 358.

A capping layer pattern 360 may be formed on a top surface of each of the first to third conductive patterns 350, 352 and 354.

Figure 31:
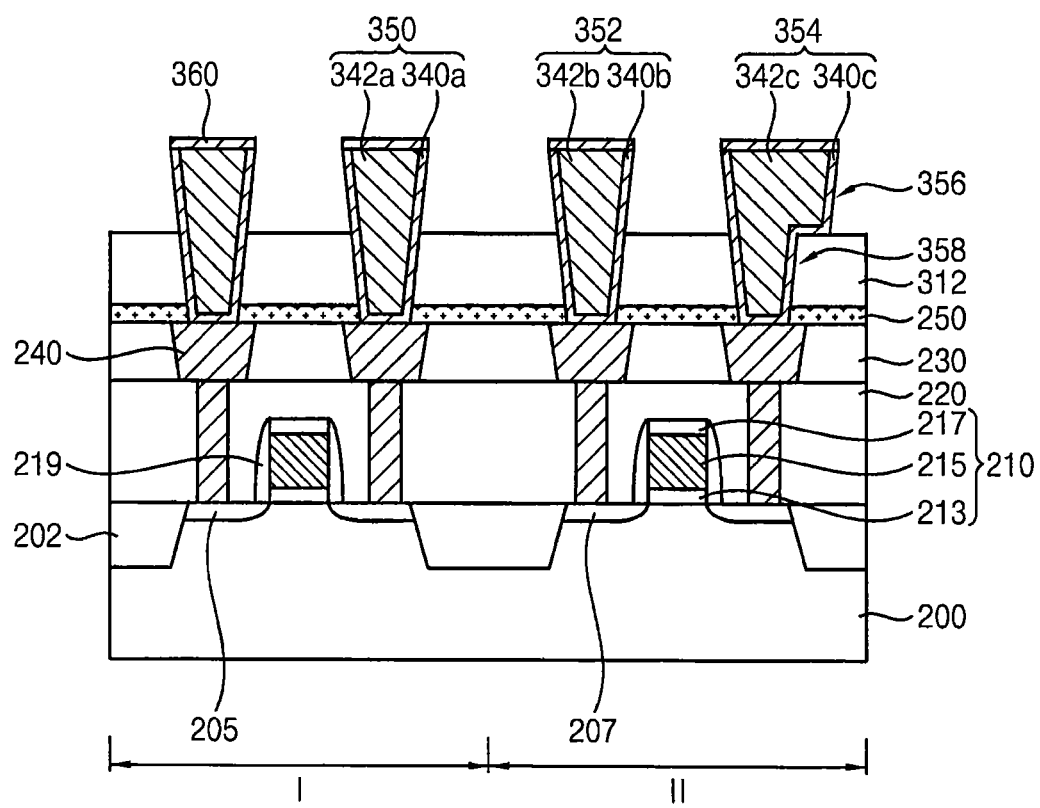

Referring to FIG. 31, a process substantially the same as or similar to that illustrated with reference to FIG. 20 may be performed to remove the sacrificial layer 314. Accordingly, upper portions of the first to third conductive patterns 350, 352 and 354 and the top surface of the supporting layer 312 may be exposed.

Figure 32:
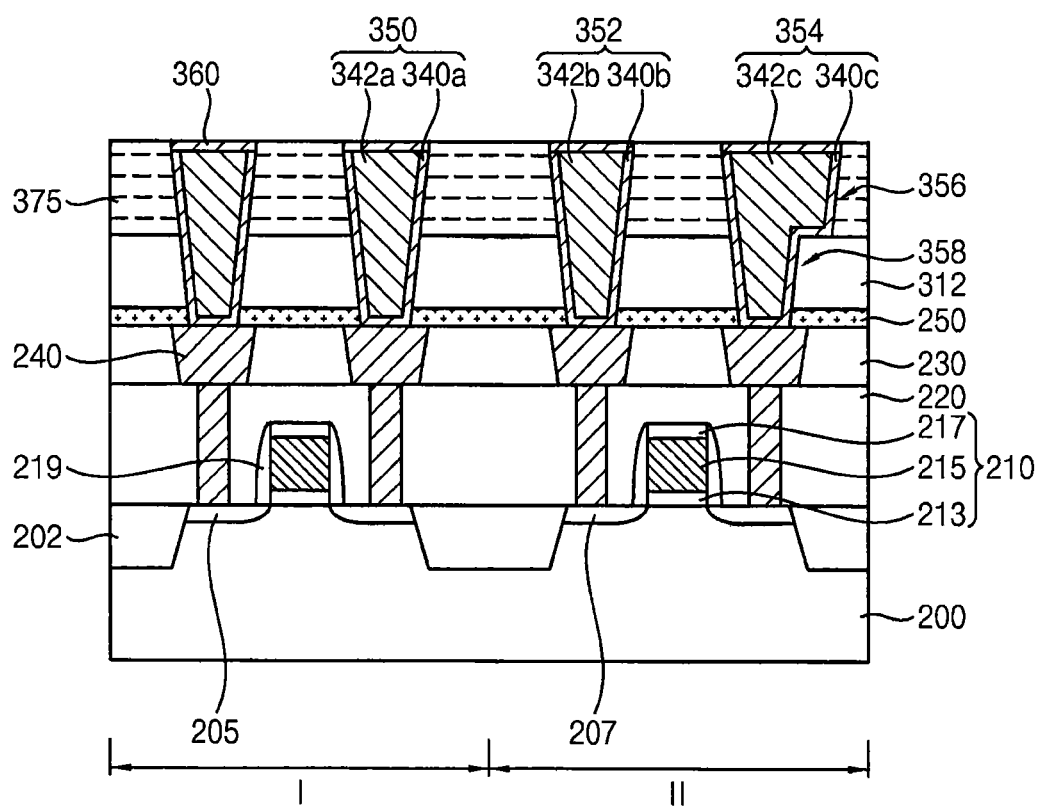

Referring to FIG. 32, processes substantially the same as or similar to FIGS. 8 to 10, or FIG. 21 may be performed.

In example embodiments, a first insulating interlayer covering the first to third conductive patterns 350, 352 and 354, and the capping layer pattern 360 may be formed on the supporting layer 312. The first insulating interlayer may be converted into a modified first insulating interlayer 375 by a modification treatment. An upper portion of the modified first insulating interlayer 375 may be planarized such that the capping layer pattern 360 may be exposed.

According to example embodiments as described above, a semiconductor element including the CMOS transistor may be formed on the substrate 200, and a conductive structure electrically connected to the semiconductor element may be formed. The conductive structure may include the first to third conductive patterns 350, 352 and 354, and an insulation structure therebetween. The insulation structure, e.g., the modified first insulating interlayer 375 may include a low-k material. Thus, a parasitic capacitance between the first to third conductive patterns 350, 352 and 354 may be reduced, and an RC delay of the semiconductor device may be suppressed.

In some example embodiments, an additional wiring build-up process may be further performed on the conductive structure as described below.

Figure 33:
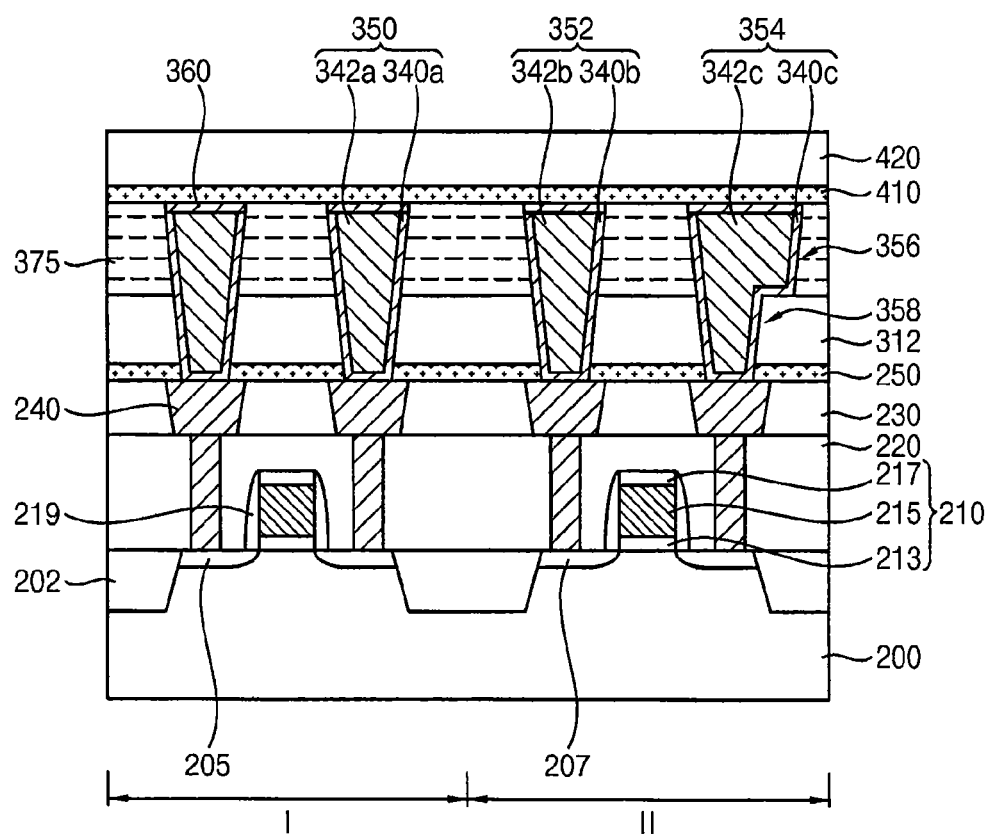

Referring to FIG. 33, a third etch-stop layer 410 may be formed on the modified first insulating interlayer 375, and a second insulating interlayer 420 may be formed on the third etch-stop layer 410. For example, the third etch-stop layer 410 and the second insulating interlayer 420 may be formed of silicon nitride and silicon oxide, respectively.

The third etch-stop layer 410 may prevent a damage of the modified first insulating interlayer 375 by the build-up process.

Figure 34:
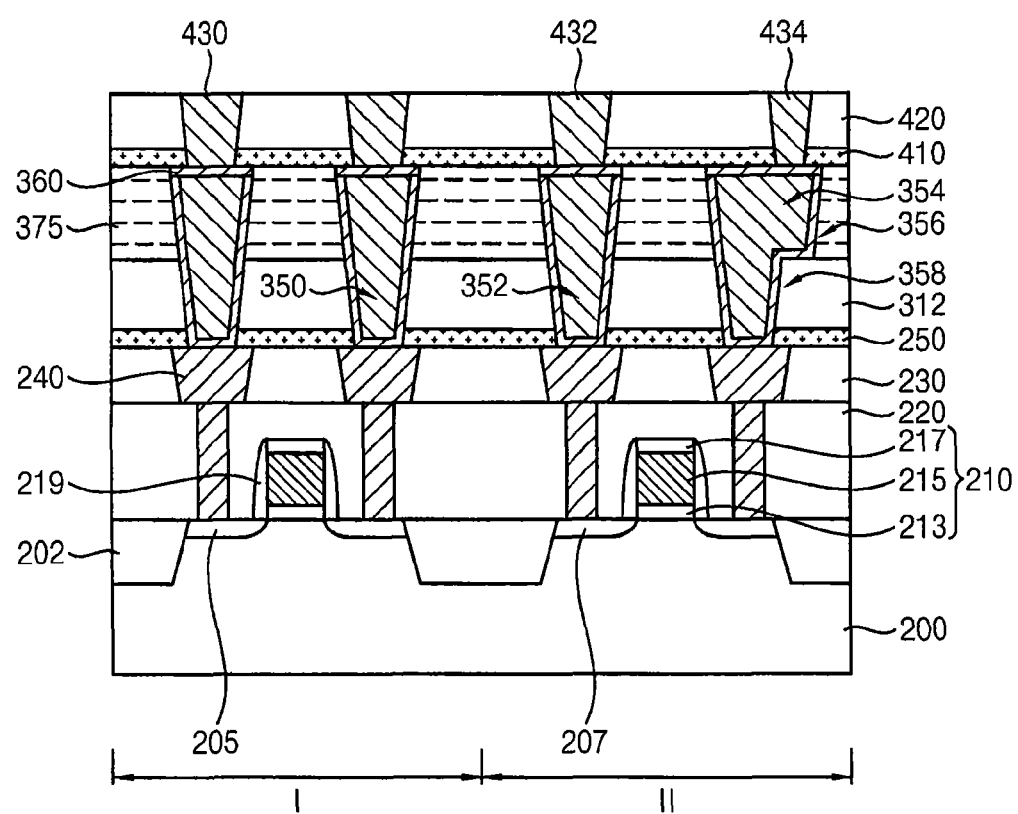

Referring to FIG. 34, upper contacts electrically connected to the first to third conductive patterns 350, 352 and 354 may be formed through the second insulating interlayer 420 and the third etch-stop layer 410.

For example, the upper contacts may include a first upper contact 430, a second upper contact 432 and a third upper contact 434 in contact with the first conductive pattern 350, the second conductive pattern 352 and the third conductive pattern 354, respectively.

The upper contacts may be formed by a plating process or a deposition process such as a sputtering process using a metal, e.g., copper or tungsten.

Figure 35:
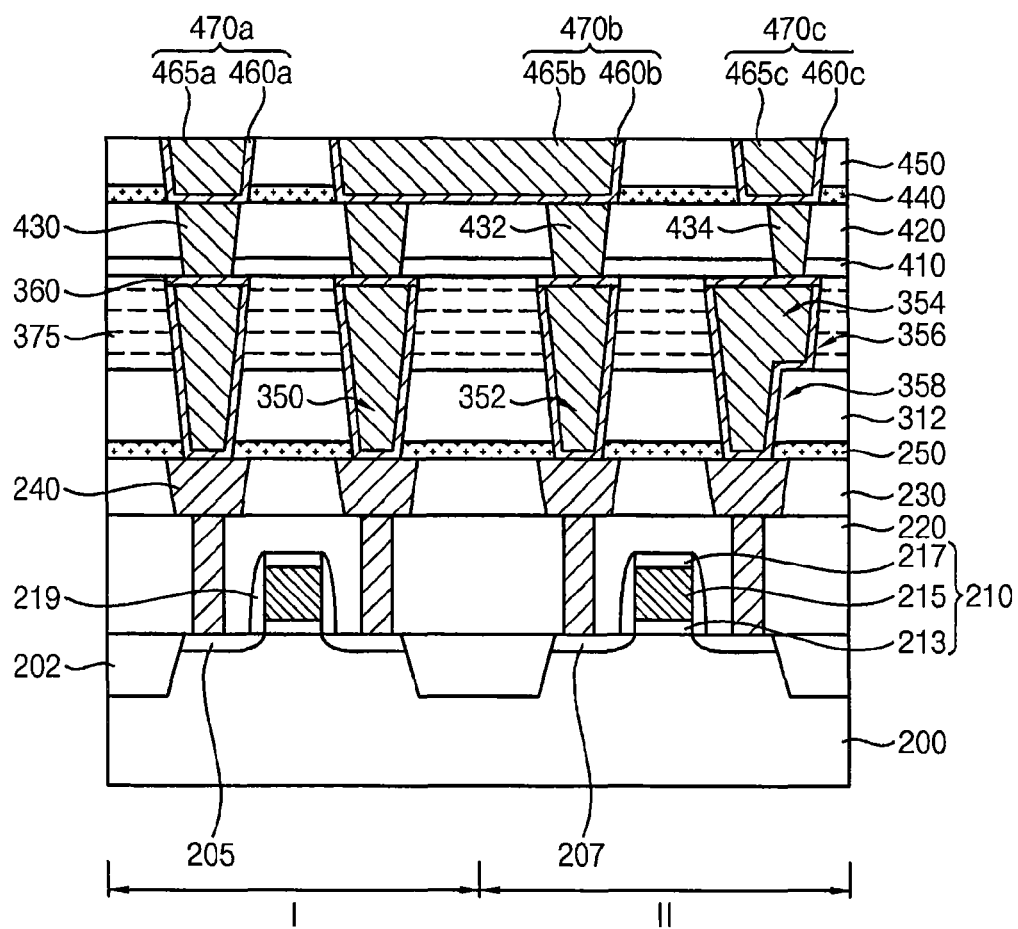

Referring to FIG. 35, a fourth etch-stop layer 440 and a third insulating interlayer 450 may be formed on the second insulating interlayer 420. Wirings electrically connected to the upper contacts may be formed through the third insulating interlayer 450 and the fourth etch-stop layer 440.

For example, the wirings may include a first wiring 470a, a second wiring 470b and a third wiring 470c. The first to third wirings 470a, 470b and 470c may have a stacked structure including barrier layer patterns 460a, 460b and 460c, and conductive layer patterns 465a, 465b and 465c.

In some embodiments, the first wiring 470a and the third wiring 470c may be electrically connected to the first upper contact 430 and the third upper contact 434, respectively. The second wiring 470b may be electrically connected commonly to the first upper contact 430 and the second upper contact 432. Accordingly, the second wiring 470b may be configured to transfer an electrical signal between the first region I and the second region II.

In some embodiments, the first to third wirings 470a, 470b and 470c may be formed by processes substantially the same as or similar to those for the formation of the first to third conductive patterns 350, 352 and 354 as illustrated in FIGS. 28 to 32.

According to example embodiments of the present inventive concepts, conductive patterns may be formed in a sacrificial layer, and then the damaged sacrificial layer may be removed by an ashing process. Subsequently, an insulating interlayer may be formed between the conductive patterns. Thus, the insulating interlayer having a low-k value without an etching damage may be formed between the conductive patterns. Further, a carbon concentration may be controlled while forming the sacrificial layer, so that a removed thickness or a removed height of the sacrificial layer may be adjusted. For example, a conductive structure including an insulating interlayer that may have a dielectric constant (k) less than about 2.5 or less than about 2.0 may be obtained by the method according to example embodiments. The conductive structure may be implemented in a semiconductor device including, e.g., a nano-scaled wiring.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, comprising:
    forming a single sacrificial layer including an inorganic insulative material on a lower contact by an in-situ deposition process such that a carbon source is provided with a time interval after a source of the inorganic insulative material is provided in a same process chamber and the carbon concentration increases from a lower portion to an upper portion;
    forming a conductive pattern extending through the sacrificial layer to electrically connect to the lower contact;
    removing the upper portion of the sacrificial layer such that the conductive pattern is exposed by the lower portion of the sacrificial layer; and
    forming an insulating interlayer on the lower portion of the sacrificial layer to cover the conductive pattern, wherein a dielectric constant of the insulating interlayer is less than a dielectric constant of the upper portion of the sacrificial layer,
    wherein removing the upper portion of the sacrificial layer includes:
    combusting the carbon of the upper portion of the sacrificial layer in at least a subsequent process for forming the conductive pattern, to increase an etch rate of the upper portion of the sacrificial layer relatively with respect to the lower portion of the sacrificial layer; and performing an etching process to the upper portion of the sacrificial layer, thereby remaining the lower portion of the sacrificial layer.

2. The method of claim 1, wherein the inorganic insulative material comprises a silicon-oxide based material such that the lower portion of the sacrificial layer includes a carbon-free sacrificial layer and the upper portion of the sacrificial layer includes a carbon-doped sacrificial layer.

3. The method of claim 2, wherein the lower contact is included in a plurality of lower contacts, wherein forming the conductive pattern includes forming a first conductive pattern, a second conductive pattern and a third conductive pattern, the first conductive pattern and the third conductive pattern extending through the sacrificial layer to electrically contact respective ones of the lower contacts and the second conductive pattern being disposed in the sacrificial layer and electrically isolated from the plurality of the lower contacts.

4. The method of claim 3, wherein the third conductive pattern includes a via portion making contact with one of the respective lower contacts, and an expanded portion integrally connected to the via portion, the expanded portion having a larger width than that of the via portion such that a stepped surface is defined to be at boundary between the via portion and the expanded portion.

5. The method of claim 4, wherein a top surface of the lower portion of the sacrificial layer, a bottom of the second conductive pattern and the stepped surface of the third conductive pattern are coplanar with each other.

6. The method of claim 4, wherein a top surface of the lower portion of the sacrificial layer is higher than a bottom of the second conductive pattern and the stepped surface of the third conductive pattern such that the lower portion of the sacrificial layer is provided as a supporting layer for increasing a structural stability of the second and the third conductive patterns.

7. The method of claim 2, wherein the upper portion of the sacrificial layer has a density less than that of the lower portion of the sacrificial layer.

8. The method of claim 2, wherein forming the sacrificial layer includes:

loading an object including the lower contact into the process chamber;

providing a silicon source and a reactive gas to the process chamber; and providing the carbon source to the process chamber at a predetermined carbon time after providing the silicon source and the reactive gas.

9. The method of claim 8, wherein the silicon source is provided to the process chamber at a first phase and a flow rate of the silicon source is gradually increased to a steady state at a second phase and the carbon source is initiated to provide into the process chamber at the carbon time in a third phase at which the flow rate of the silicon source is maintained at the steady state.

10. The method of claim 9, wherein a flow rate of the reactive gas is maintained at a steady state from the first phase to the third phase.

11. The method of claim 9, wherein a formation of the carbon-free sacrificial layer is terminated at the carbon time and a formation of the carbon-doped sacrificial layer initiates at the carbon time such that a thickness of the lower portion of the sacrificial layer is determined by the carbon time.

12. The method of claim 11, wherein the carbon concentration of the carbon-doped sacrificial layer is controlled by a time lapse between the carbon time and a termination of the formation of the carbon-doped sacrificial layer such that a thickness of the upper portion of the sacrificial layer is determined by the time lapse and a thickness of the insulating interlayer is controlled by the carbon time.

13. The method of claim 1, further comprising:

forming a first etch-stop layer covering the lower contact before forming the sacrificial layer; and sequentially forming a buffer layer and a second etch-stop layer on the sacrificial layer.

14. The method of claim 13, wherein forming the conductive pattern includes:

forming an opening extending through the second etch-stop layer, the buffer layer and the sacrificial layer;

forming a conductive layer on the second etch-stop layer to fill the opening; and planarizing an upper portion of the conductive layer, the second etch-stop layer and the buffer layer until the sacrificial layer is exposed.

15. The method of claim 1, further comprising:

performing a modification treatment to convert the insulating interlayer to a modified insulating interlayer.

16. The method of claim 15, wherein the modification treatment includes an ultraviolet (UV) irradiation or a plasma treatment.

17. The method of claim 15, wherein the insulating interlayer comprises a porogen material, and wherein the modified insulating interlayer has a porous structure.

18. The method of claim 1, wherein the etching process for removing the upper portion of the sacrificial layer includes one of an ashing process, a dry etching process and a wet etching process.

19. A method of manufacturing a semiconductor device, comprising:

initiating formation of a single insulation layer using a material having a composition selected to provide resistance to a subsequent etching process;

changing the composition of the material during the formation of the single insulation layer to reduce the resistance of the material to the subsequent etching process at a predetermined level in the insulation layer;

performing the subsequent etching process on the insulation layer to remove an upper portion of the insulation layer above the predetermined level and leaving a lower portion of the insulation layer below the predetermined level between adjacent ones of conductive patterns extending through the lower portion of the insulation layer; and forming a low-k dielectric material on the lower portion of the insulation layer between the adjacent conductive patterns to replace the upper portion of the insulation layer above the predetermined level, wherein a dielectric constant of the low-k dielectric material is less than a dielectric constant of the upper portion of the insulation layer, wherein the resistance of the material to the subsequent etching process is reduced by combusting the composition of the material of the insulation layer above the predetermined level.

* * * * *